(12) United States Patent
Fishburn et al.

(10) Patent No.: US 11,501,804 B2
(45) Date of Patent: Nov. 15, 2022

(54) MICROELECTRONIC DEVICES INCLUDING SEMICONDUCTIVE PILLAR STRUCTURES, AND RELATED ELECTRONIC SYSTEMS

(71) Applicant: Micron Technology, Inc., Boise, ID (US)

(72) Inventors: Fredrick D. Fishburn, Hiroshima (JP); Si-Woo Lee, Boise, ID (US); Scott L. Light, Boise, ID (US); Song Guo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/992,589

(22) Filed: Aug. 13, 2020

(65) Prior Publication Data

US 2022/0051699 A1 Feb. 17, 2022

(51) Int. Cl.
*H01L 27/108* (2006.01)
*G11C 5/06* (2006.01)

(52) U.S. Cl.
CPC ........ *G11C 5/063* (2013.01); *H01L 27/10814* (2013.01); *H01L 27/10823* (2013.01); *H01L 27/10855* (2013.01); *H01L 27/10876* (2013.01); *H01L 27/10885* (2013.01); *H01L 27/10888* (2013.01)

(58) Field of Classification Search
None
See application file for complete search history.

(56) References Cited

U.S. PATENT DOCUMENTS

| 2006/0043472 | A1* | 3/2006 | Wang | H01L 29/7841 257/330 |
|---|---|---|---|---|
| 2014/0370684 | A1* | 12/2014 | Khurana | H01L 21/0273 438/386 |
| 2015/0021684 | A1* | 1/2015 | Lee | H01L 27/10823 257/330 |
| 2016/0099248 | A1* | 4/2016 | Wu | H01L 29/0649 257/296 |
| 2016/0104709 | A1 | 4/2016 | Pulugurtha et al. | |
| 2017/0110364 | A1 | 4/2017 | Song et al. | |
| 2018/0019245 | A1* | 1/2018 | Yang | H01L 21/76877 |
| 2020/0027486 | A1 | 1/2020 | Pandey et al. | |
| 2020/0066730 | A1* | 2/2020 | Guo | H01L 21/3086 |
| 2020/0090929 | A1 | 3/2020 | Tran et al. | |
| 2020/0243534 | A1* | 7/2020 | Liu | H01L 27/10876 |

* cited by examiner

*Primary Examiner* — Steven M Christopher
(74) *Attorney, Agent, or Firm* — TraskBritt

(57) ABSTRACT

A microelectronic device comprises a semiconductive pillar structure comprising a central portion, a first end portion, and a second end portion on a side of the central portion opposite the first end portion, the first end portion oriented at an angle with respect to the central portion and extending substantially parallel to the second end portion, a digit line contact on the central portion of the semiconductive pillar structure, a first storage node contact on the first end portion, and a second storage node contact on the second end portion. Related microelectronic devices, electronic systems, and methods are also described.

25 Claims, 16 Drawing Sheets

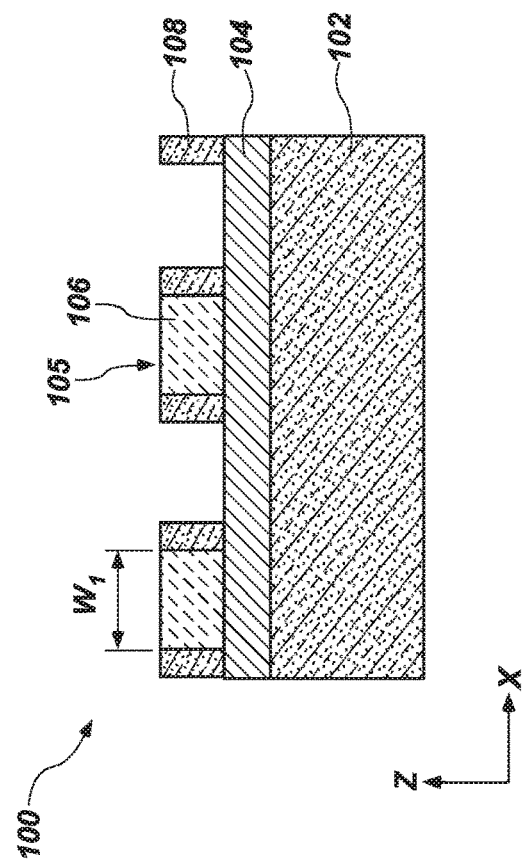
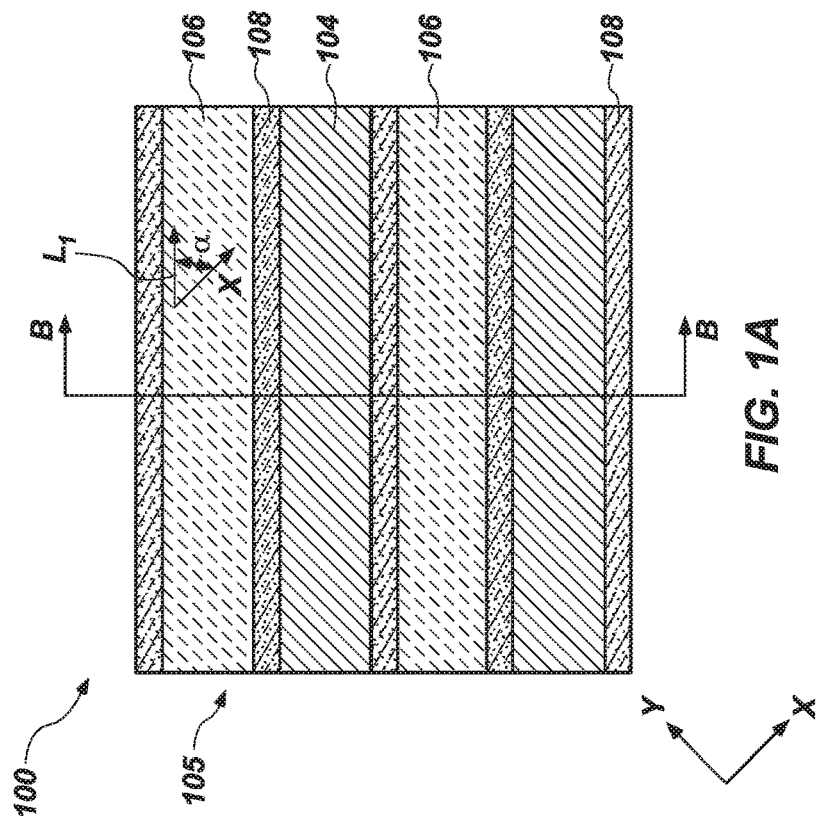
FIG. 1A
FIG. 1B

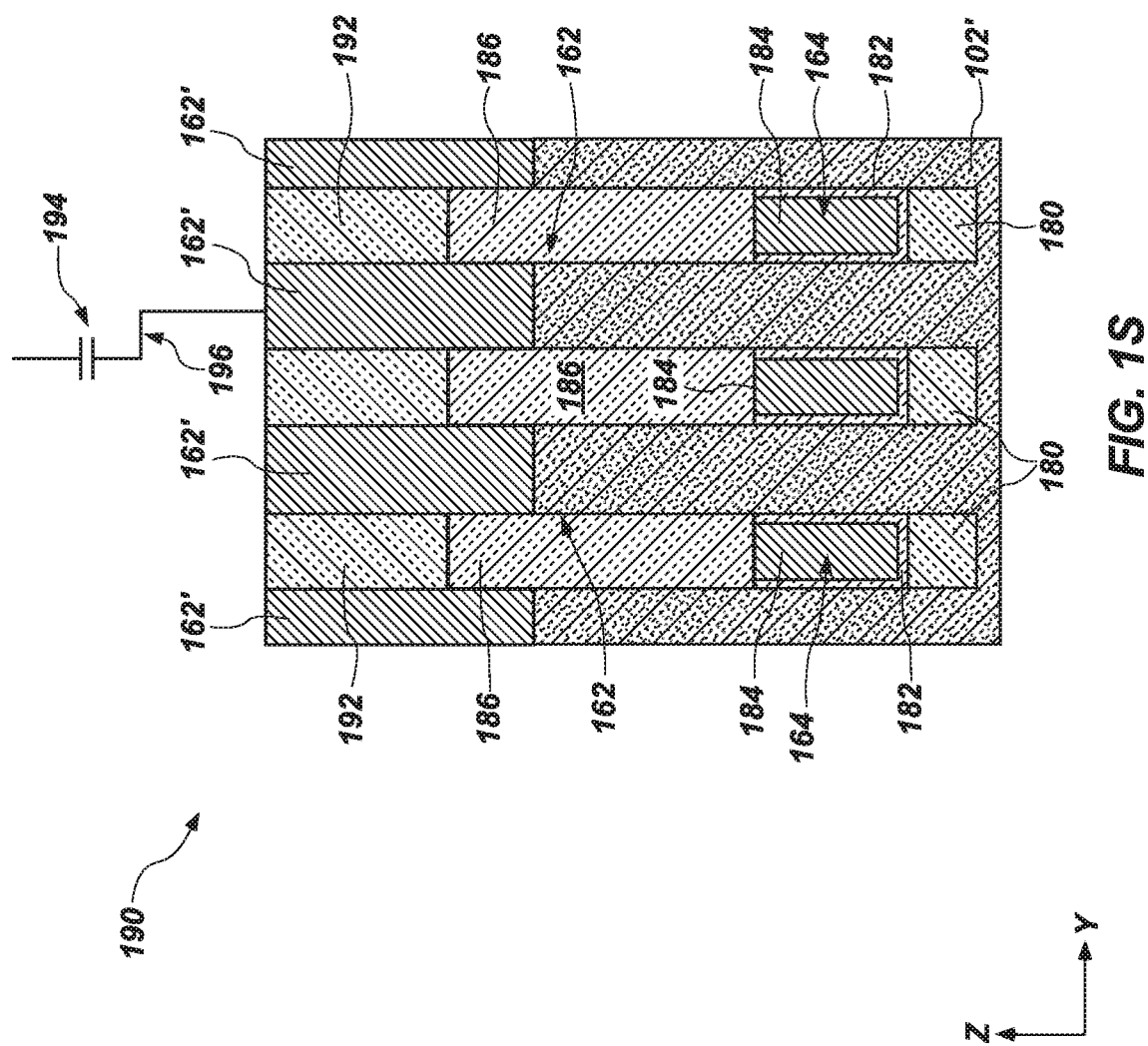

MICROELECTRONIC DEVICES INCLUDING SEMICONDUCTIVE PILLAR STRUCTURES, AND RELATED ELECTRONIC SYSTEMS

CROSS-REFERENCE TO RELATED APPLICATIONS

This application is related to U.S. patent application Ser. No. 16/992,615, filed on even date herewith, Aug. 13, 2020, for "MICROELECTRONIC DEVICES INCLUDING SEMICONDUCTIVE PILLAR STRUCTURES, AND RELATED METHODS AND ELECTRONIC SYSTEMS."

TECHNICAL FIELD

The disclosure, in various embodiments, relates generally to the field of microelectronic device design and fabrication. More specifically, the disclosure relates to methods of forming microelectronic devices comprising semiconductive pillar structures, and to related microelectronic devices and electronic systems.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

A relatively common semiconductor device is a memory device. A memory device may include a memory array having a number of memory cells arranged in a grid pattern. One type of memory cell is a dynamic random access memory (DRAM). In the simplest design configuration, a DRAM cell includes one access device, such as a transistor, and one storage device, such as a capacitor. Modern applications for memory devices can utilize vast numbers of DRAM unit cells, arranged in an array of rows and columns. The DRAM cells are electrically accessible through digit lines and word lines arranged along the rows and columns of the array.

Reducing the dimensions and spacing of memory device features places ever increasing demands on the methods used to form the memory device features. For example, one of the limiting factors in the continued shrinking of memory devices is inadvertent shorting between contacts associated with various components of the DRAM cells. As used herein, a "contact" refers to a connection facilitating a conductive pathway between at least two structures. For example, in a DRAM device exhibiting a dual bit memory cell structure, a digit line contact is provided between a digit line and an access device (e.g., a transistor) formed in or above a substrate, and storage node contacts are formed between the access device and a storage node (e.g., a capacitor) where electrical charge may be stored. As the dimensions of the memory device (e.g., DRAM device) features decrease, the packing density of the contacts associated therewith increases, resulting in an increased likelihood of inadvertently shorting various components together, which can adversely affect memory device performance. In some instances, the digit line contact may inadvertently contact the storage node contact, electrically shorting the digit line to the storage node and resulting in failure of the memory cell associated with the storage node.

DETAILED DESCRIPTION

Figure 1C:
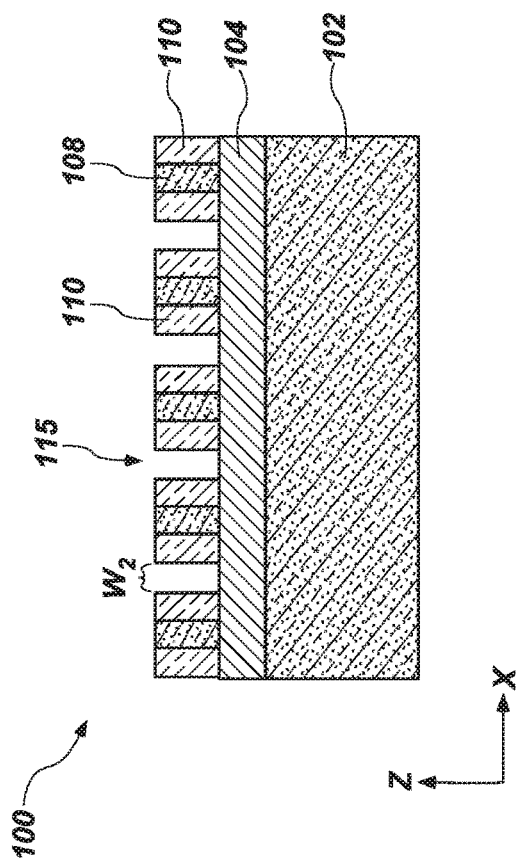
FIG. 1A through FIG. 1S are simplified partial to-down views (FIG. 1A, FIG. 1C, FIG. 1F through FIG. 1J, FIG. 1L, FIG. 1M, and FIG. 1P) and simplified partial cross-sectional views (FIG. 1B, FIG. 1D, FIG. 1K, FIG. 1N, FIG. 1O, and FIG. 1Q through FIG. 1S) illustrating a method of forming a microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a memory device, such as a DRAM memory device, a 3D NAND Flash memory device) or a complete microelectronic device. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "adjacent" one another means and includes features of the disclosed identity (or identities) that are located most proximate (e.g., closest to, neighboring) one another. Additional features (e.g., additional regions, additional materials, additional structures, additional devices) not matching the disclosed identity (or identities) of the "adjacent" features may be disposed between the "adjacent" features. Put another way, the "adjacent" features may be positioned directly neighboring one another, such that no other feature intervenes between the "adjacent" features; or the "adjacent" features may be positioned indirectly adjacent one another, such that at least one feature having an identity other than that associated with at least one the "adjacent" features is positioned between the "adjacent" features. Accordingly, features described as "vertically adjacent" one another means and includes features of the disclosed identity (or identities) that are located most vertically proximate (e.g., vertically closest to, vertically neighboring) one another. Moreover, features described as "horizontally adjacent" one another means and includes features of the disclosed identity (or identities) that are located most horizontally proximate (e.g., horizontally closest to, horizontally neighboring) one another.

As used herein, the term "memory device" means and includes microelectronic devices exhibiting memory functionality, but not necessary limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes an electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes an electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including the insulative material.

As used herein, a "selectively removable" material means and includes a material that exhibits a greater removal rate responsive to process conditions, such as exposure to radiation (e.g., heat), relative to another material exposed to the same process conditions. A material that is selectively removable relative to another material is substantially completely removable without substantially removing the another material (e.g., without removing substantially any of the another material).

As used herein, a "selectively etchable" material means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

According to embodiments described herein, a microelectronic device includes semiconductive pillar structures (e.g., elongate semiconductive pillar structures having a larger length than a width thereof), elongate semiconductive pillar structure including a bit line contact region laterally disposed between two storage node contact regions. The bit line contact region may be in electrical communication with a bit line contact that is, in turn, in electrical communication with a bit line extending in a first lateral direction. Each of the storage node contact regions is individually in electrical communication with a storage node contact, each of which is in electrical communication with a storage node (e.g., a capacitor, which may also be referred to herein as a cell capacitor). Each semiconductive pillar structure may include a central portion including the bit line contact region, a first end portion at a first end of the central portion, and a second end portion at a second, opposite end of the central portion. The first end portion includes a first one of the storage node contact regions and the second end portion includes a second one of the storage node contact regions. The central portion may extend in the first lateral direction and include a longitudinal axis substantially parallel with the bit line. In other words, the central portion may be elongated in a direction in which the bit line extends. Each of the first end portion and the second end portion include a longitudinal axis that is oriented at an angle with respect to the longitudinal axis of the central portion. Stated another way, each of the first end portion and the second end portion extend at an angle with respect to the central portion. In some embodiments, the semiconductive pillar structures exhibit a so-called "S" shape.

Orienting the first end portion and the second end portion at an angle with respect to the central portion facilitates an increased distance between the storage node contact regions and the bit line contact region of the semiconductive pillar structure, reducing a likelihood of inadvertent shorting between such features compared to conventional microelectronic devices. In addition, orienting the first end portion and the second end portion at an angle with respect to the central portion facilitates an increased active area of the semiconductive pillar structures (e.g., an increased active area for the bit line contacts and each of the storage node contacts). Further, forming the end portions at an angle with respect to the central portion may facilitate an increased area (e.g., a greater margin) for formation of the bit line contact on the bit line contact region and formation of spacers along the bit lines, which spacers may reduce capacitive coupling between the bit lines. In some embodiments, the shape of the semiconductive pillar structures may reduce (e.g., eliminate) an overlap between word line structures and the bit line contact regions of the semiconductive pillar structures compared to conventional pillar structures. In some embodiments, forming the first end portion and the second end portion at an angle with respect to the central portion may facilitate increased mechanical stability (and a reduction in toppling) of the semiconductive pillar structures compared to conventional pillar structures that exhibit a linear shape. Further, a distance between so-called passing word line structures that vertically overlie a semiconductive pillar structure but do not electrically couple thereto, may be increased, reducing inadvertent coupling between adjacent word lines and so-called "row hammer."

The microelectronic device may be formed by patterning first and second spacers adjacent to (e.g., on, over) a base material, the first and second spacers extending in a first lateral direction. For example, first spacers may be formed on the base material by a pitch doubling process and second spacers may be formed on sides of each of the first spacers. First trenches may be located between adjacent ones of the second spacers. Second trenches may be formed through the first and second spacers in a second lateral direction to form isolated structures, each comprising a portion of the first spacer between portions of the second spacer. A sacrificial material may be formed within the first trenches and the second trenches and between the isolated structures. In some embodiments, openings may remain within intersections between the first trenches and the second trenches. The sacrificial material may be selectively removed (e.g., relative to the first spacers and the second spacers) from the intersections and between adjacent isolated structures. In some embodiments, the sacrificial material is selectively (e.g., preferentially) removed in a third lateral direction. The elongate openings are filled with a material that bridges between a second spacer of a first isolated structure and a second spacer of a second isolated structure. The material filling the elongate openings may exhibit an etch selectivity with respect to the material of the first spacers and the sacrificial material. The first spacers and sacrificial material are selectively removed to form a pattern of pillar structures from the portions of the second spacers and the material filling the elongate openings. The pattern of pillar structures is transferred to the base material to form the semiconductive pillar structures. A digit line contact may be formed on the central portion of each semiconductive pillar structure and a storage node contact may be formed on each end portion of each semiconductive pillar structure. Digit lines, extending in the third lateral direction, may be formed in electrical communication with the digit line contacts and storage node structures may be formed in electrical communication with the storage node contacts.

FIG. 1A through FIG. 1S are simplified partial to-down views (FIG. 1A, FIG. 1C, FIG. 1F through FIG. 1J, FIG. 1L, FIG. 1M, and FIG. 1P) and simplified partial cross-sectional views (FIG. 1B, FIG. 1D, FIG. 1K, FIG. 1N, FIG. 1O, and FIG. 1Q through FIG. 1S) illustrating a method of forming a microelectronic device (e.g., a memory device, such as a DRAM device), in accordance with embodiments of the disclosure. With the description provided below, it will be readily apparent to one of ordinary skill in the art that the methods described herein may be used in various devices. In other words, the methods of the disclosure may be used whenever it is desired to form a microelectronic device including the elongate pillar structures.

Referring collectively to FIG. 1A and FIG. 1B, a microelectronic device structure 100 may include a base material 102, an etch stop material 104 adjacent to (e.g., on, over, vertically overlying) the base material 102, and first lines 105 of a photoresist material 106 adjacent to (e.g., on, over, vertically overlying) the etch stop material 104. First spacers 108 may be formed on sides of the first lines 105 of the photoresist material 106. FIG. 1B is a simplified cross-sectional view of the microelectronic device structure 100 of FIG. 1A taken through section line B-B.

With reference to FIG. 1A, the first lines 105 of the photoresist material 106 may extend at an angle with respect to a first lateral direction (e.g., the X-direction) in which one or more features of the microelectronic device structure 100 will be formed (e.g., word lines 164 (FIG. 1M, FIG. 1N)), as will be described herein. For example, longitudinal axis $L_1$ of the first lines 105 may be oriented at a first angle α with respect to the X-direction. The first angle α may be greater than about zero (0) degrees and less than about ninety (90) degrees relative to the first lateral direction, such as within a range of from about twenty (20) degrees to about seventy (70) degrees, from about thirty (30) degrees to about sixty (60) degrees, or from about forty (40) degrees to about fifty (50) degrees. The first angle a may be selected at least partially based on a desired architecture of the microelectronic device structure 100, and on desired dimensions of features to be formed from the base material 102, as will be described below. In some embodiments, the first angle a is about forty-one (41) degrees.

The base material 102 may include a semiconductor substrate, a base semiconductor material on a supporting substrate, a metal electrode, or a semiconductor substrate having one or more materials, structures, or regions formed thereon. The base material 102 may comprise a semiconductive material, such as a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base material" in the following description, previous process stages may have been utilized to form materials, regions, or junctions in the base semiconductor structure or foundation. The base material 102 may include one or more materials associated with integrated circuit fabrication. Such materials may include, for example, one or more of refractory metals, barrier materials, diffusion materials, and insulative materials. The base material 102 may include, for example, complementary metal oxide semiconductor (CMOS) structures, or other semiconductor structures. Different portions of the base material 102 may be electrically isolated from each other by one or more dielectric materials.

The etch stop material 104 may be formed of and include one or more materials exhibiting an etch selectivity to various mask materials (e.g., spacer materials), as will be described herein. By way of non-limiting example, the etch stop material 104 may exhibit an etch selectivity with respect to various materials, such as sacrificial materials (e.g., amorphous carbon) and dielectric materials (e.g., silicon dioxide, silicon nitride). The etch stop material 104 may be formed of and include one or more of a metal nitride (e.g., titanium nitride, tungsten nitride, tantalum nitride, aluminum nitride), a metal oxide (e.g., aluminum oxide, titanium oxide, tungsten oxide, tantalum oxide, hafnium oxide, zirconium oxide), an oxynitride material, a silicon oxycarbide, a silicon carboxynitride material, amorphous carbon, or another material. In some embodiments, the etch stop material 104 comprises titanium nitride.

The photoresist material 106 may be formed of and include one or more of a 193 nanometer (nm) photoresist material, a 248 nm photoresist material, or a photoresist material sensitive to radiation of a different wavelength. The photoresist material 106 may be a positive or a negative photoresist material, a photopolymeric photoresist material, a photodecomposing photoresist material, or a photocrosslinking photoresist material. Photoresist materials, such as positive and negative resists, are known in the art and, therefore, are not described in detail herein.

Each of the first lines 105 of the photoresist material 106 may have substantially the same width $W_1$ (e.g., minor lateral dimension), and may be regularly spaced by substantially the same distance. Accordingly, a pitch between centerlines of adjacent first lines 105 may be substantially uniform throughout the photoresist material 106. The dimensions and spacing of the first lines 105 may be selected to provide desired lateral dimensions and lateral spacing to features to be subsequently formed from the base material 102, as will be further described below.

The width $W_1$ may be within a range from about 20 nm to about 50 nm, such as from about 20 nm to about 30 nm, from about 30 nm to about 40 nm, or from about 40 nm to about 50 nm. However, the disclosure is not so limited and the width $W_1$ may be different than those described above.

The first spacers 108 may extend as lines substantially parallel to the first lines 105 of the photoresist material 106. The first spacers 108 may be formed of and include a material exhibiting an etch selectivity with respect to one or more oxide materials (e.g., silicon dioxide), and one or more nitride materials (e.g., silicon nitride, titanium nitride). In some embodiments, the first spacers 108 are formed of and include amorphous silicon, such as hydrogenated amorphous silicon. The material of the first spacers 108 may be formed by conventional techniques adjacent to the first lines 105 and patterned to form the first spacers 108.

In some embodiments, formation of the first spacers 108 on sides of the first lines 105 of the photoresist material 106 may be conducted by using a so-called "pitch doubling" process, wherein the pitch of the photoresist material 106 is halved by formation of the first spacers 108 on the sides of the first lines 105. In other words, the microelectronic device structure 100 may include two first spacers 108 for each first line 105 of the first lines 105, facilitating the reduction of the pitch of the first lines 105.

Figure 1D:
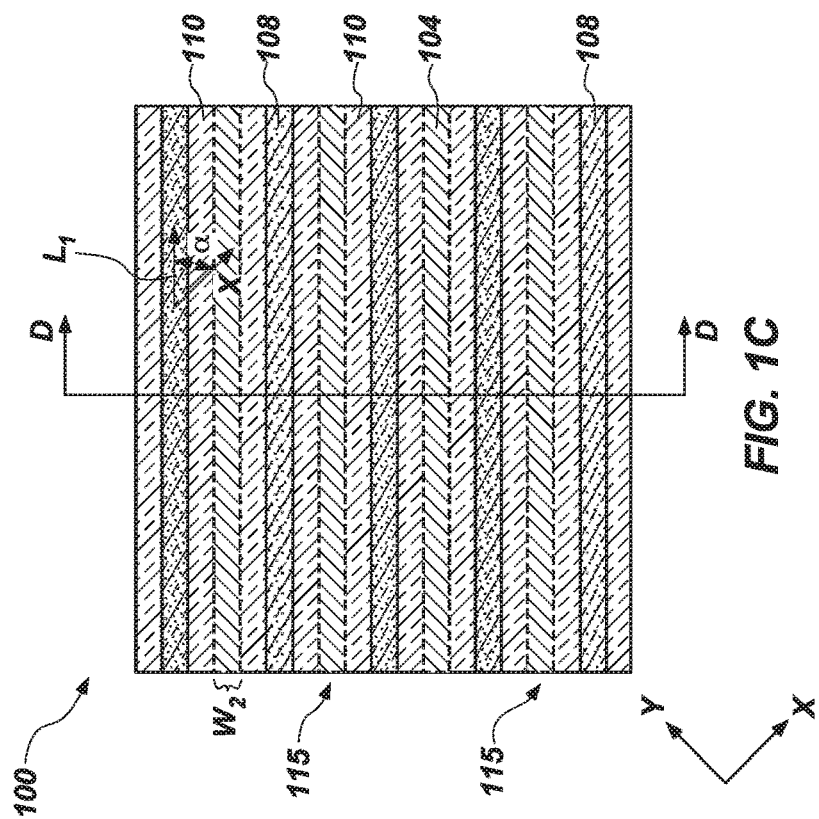

With reference to FIG. 1C and FIG. 1D, the first lines 105 (FIG. 1A, FIG. 1B) of the photoresist material 106 (FIG. 1A, FIG. 1B) may be removed (e.g., stripped) from surfaces of the microelectronic device structure 100, leaving a pattern of the first spacers 108. After removing the photoresist material 106, second spacers 110 may be formed on sides of the first spacers 108. The material of the second spacers 110 may be formed by conventional techniques adjacent to the first lines 105 and patterned to form the second spacers 110. Accordingly, two second spacers 110 may be formed for each of the first spacers 108 (and four second spacers 110 may be formed for each of the first lines 105). Accordingly, formation of the second spacers 110 may be referred to herein as a so-called "pitch quadrupling" process, since there are four of the second spacers 110 for each first line 105.

The second spacers 110 may be formed of and include one or more materials exhibiting an etch selectivity with respect to the first spacers 108. By way of non-limiting example, the second spacers 110 may be formed of and include an oxide material (e.g., a dielectric oxide material), such as silicon dioxide. In some embodiments, the second spacers 110 comprise silicon dioxide.

First trenches 115 may be located between adjacent second spacers 110. The etch stop material 104 may be exposed at lower portions (e.g., in the Z-direction) of the first trenches 115. A width $W_2$ of the first trenches 115 between adjacent second spacers 110 may be within a range from about 5 nanometers (nm) to about 20 nm, such as from about 5 nm to about 10 nm, from about 10 nm to about 15 nm, or from about 15 nm to about 20 nm. However, the disclosure is not so limited and the width $W_2$ may be different than those described above.

In some embodiments, the width $W_2$ may be selected and tailored to effect a size and shape of one or more features to be formed in the microelectronic device structure 100, as will be described herein. For example, the width $W_2$ may at least partially determine a spacing between one or more features to be formed in the microelectronic device structure 100.

Since the first spacers 108, the second spacers 110, and the first trenches 115 extend substantially parallel to the first lines 105 (FIG. 1A, FIG. 1B), a longitudinal axis of the first spacers 108, the second spacers 110, and the first trenches 115 may extend in the same direction as the longitudinal axis $L_1$. Accordingly, references to the longitudinal axis $L_1$ herein refer to the direction in which the first spacers 108, the second spacers 110, and the first trenches 115 extend.

Figure 1F:
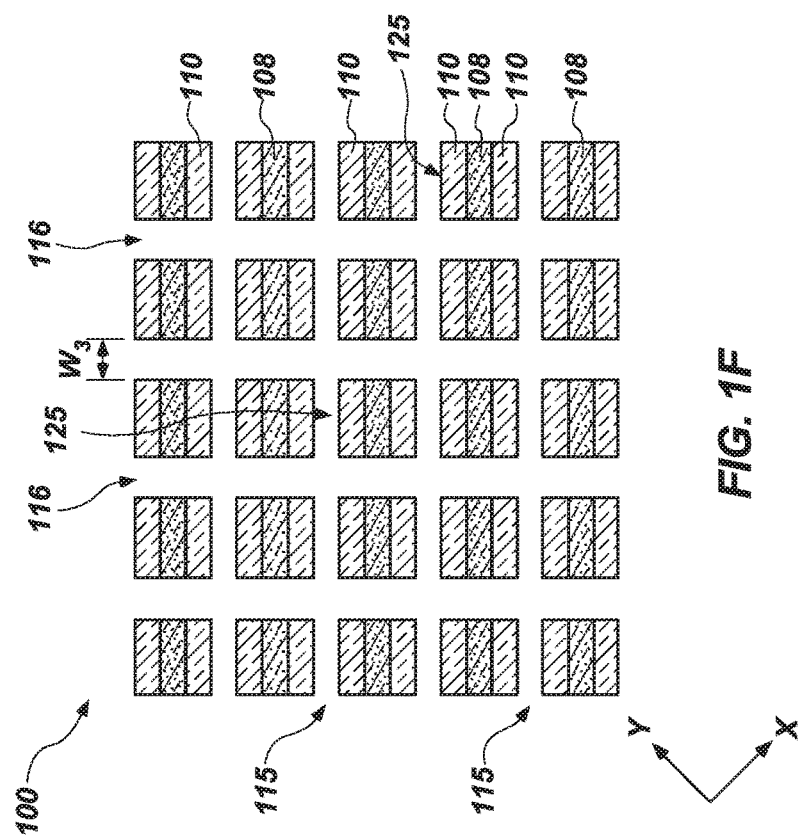
Figure 1E:
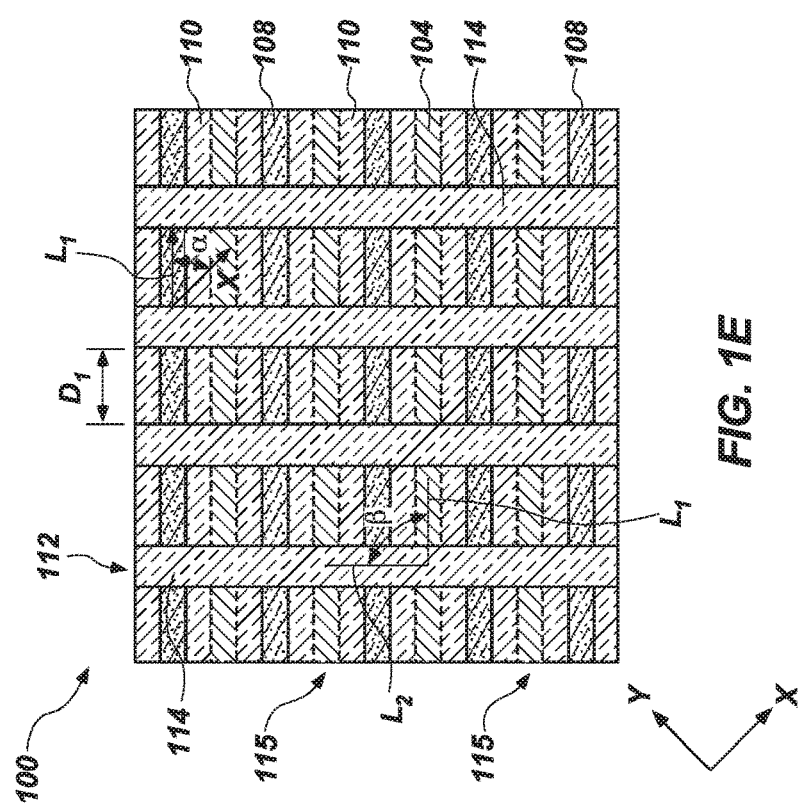

With reference to FIG. 1E, a mask (e.g., a chop mask) may be used to form and pattern second lines 112 of third spacers 114 over the microelectronic device structure 100. The second lines 112 may extend in a second lateral direction that is different than the first lateral direction of the first lines 105 (FIG. 1A, FIG. 1B) of the first photoresist material 106 (FIG. 1A, FIG. 1B).

The second lines 112 may extend at a second angle β with respect to the direction in which the first spacers 108 and the second spacers 110 extend. In other words, a longitudinal axis $L_2$ of the second lines 112 may be oriented at the second angle β with respect to the longitudinal axis $L_1$ of the first spacers 108 and the second spacers 110.

The second angle β may be within a range from about 70° to about 90°, such as from about 70° to about 75°, from about 75° to about 80°, from about 80° to about 85°, or from about 85° to about 90°. In some embodiments, the second angle β is about 82°. However, the disclosure is not so limited and the first angle α may be different than those described above.

The second lines 112 of the third spacers 114 may be formed of and include one or more materials exhibiting an etch selectivity with respect to the first spacers 108 and the second spacers 110. By way of non-limiting example, the third spacers 114 may be formed of and include a dielectric nitride, such as one or more of silicon nitride, aluminum nitride, an oxynitride, photoresist material, or another material. In some embodiments, the third spacers 114 comprise silicon nitride.

The second lines 112 may be patterned by, for example, forming lines of a second photoresist material over the microelectronic device structure 100. After forming the lines of the second photoresist material, the lines of the second photoresist material may be exposed to an etch (e.g., trimming) chemistry to form a desired spacing between adjacent lines of the second photoresist material and a desired width of the lines. The third spacers 114 may be formed on sides of the lines of the second photoresist material and the lines of the second photoresist material may be removed (e.g., stripped), as discussed above with reference to removal of the first lines 105 (FIG. 1A, FIG. 1B) of the first photoresist material 106 (FIG. 1A, FIG. 1B).

A distance $D_1$ between the third spacers 114 may be within a range from about 30 nm to about 60 nm, such as from about 30 nm to about 40 nm, from about 40 nm to about 50 nm, or from about 50 nm to about 60 nm. However, the disclosure is not so limited and the distance $D_1$ may be different than those described above.

With reference to FIG. 1F, after forming the pattern of the second lines 112 of the third spacers 114, the third spacers 114 may be used as a mask to transfer the pattern of the third spacers 114 to the underlying portions of the microelectronic device structure 100. For example, and by way of non-limiting example, a sacrificial material may be formed between the third spacers 114 and the third spacers 114 may be removed to expose portions of the first spacers 108 and the second spacers 110. The exposed portions of the first spacers 108 and the second spacers 110 may be removed through openings in the sacrificial material to form second trenches 116 at locations corresponding to the locations of third spacers 114. For ease of understanding, the etch stop material 104 is not illustrated in FIG. 1F, but it will be understood that the etch stop material 104 may be located at lower portions of the second trenches 116. In other words, the second trenches 116 may extend to the etch stop material 104.

Each of the second trenches 116 may have a width $W_3$ within a range from about 30 nm to about 60 nm, such as from about 30 nm to about 40 nm, from about 40 nm to about 50 nm, or from about 50 nm to about 60 nm. In some embodiments, the second trenches 116 have a width $W_3$ that is greater than a width $W_2$ (FIG. 1C, FIG. 1D) of the first trenches 115. In other embodiments, the width $W_3$ of the second trenches 116 is about the same as the width $W_2$ of the first trenches 115. However, the disclosure is not so limited and the width $W_3$ of the second trenches 116 may be different than those described.

As described above with reference to the width $W_2$ (FIG. 1C, FIG. 1D) of the first trenches 115, the width $W_3$ of the second trenches 116 may be selected to effect a size and shape of one or more features to be formed in the microelectronic device structure 100, as will be described herein.

Removal of portions of the exposed portions of the first spacers 108 and the second spacers 110 and formation of the second trenches 116 may form isolated structures 125, each including a portion of a first spacer 108 between portions of two of the second spacers 110. In some embodiments, the isolated structures 125 comprise amorphous silicon located between silicon dioxide. In some such embodiments, silicon dioxide may be located on a first side of the amorphous silicon and additional silicon dioxide may be located on a second, opposite side of the amorphous silicon. The isolated structures 125 may extend vertically (e.g., in the Z-direction) above the first trenches 115 and the second trenches 116.

Figure 1G:
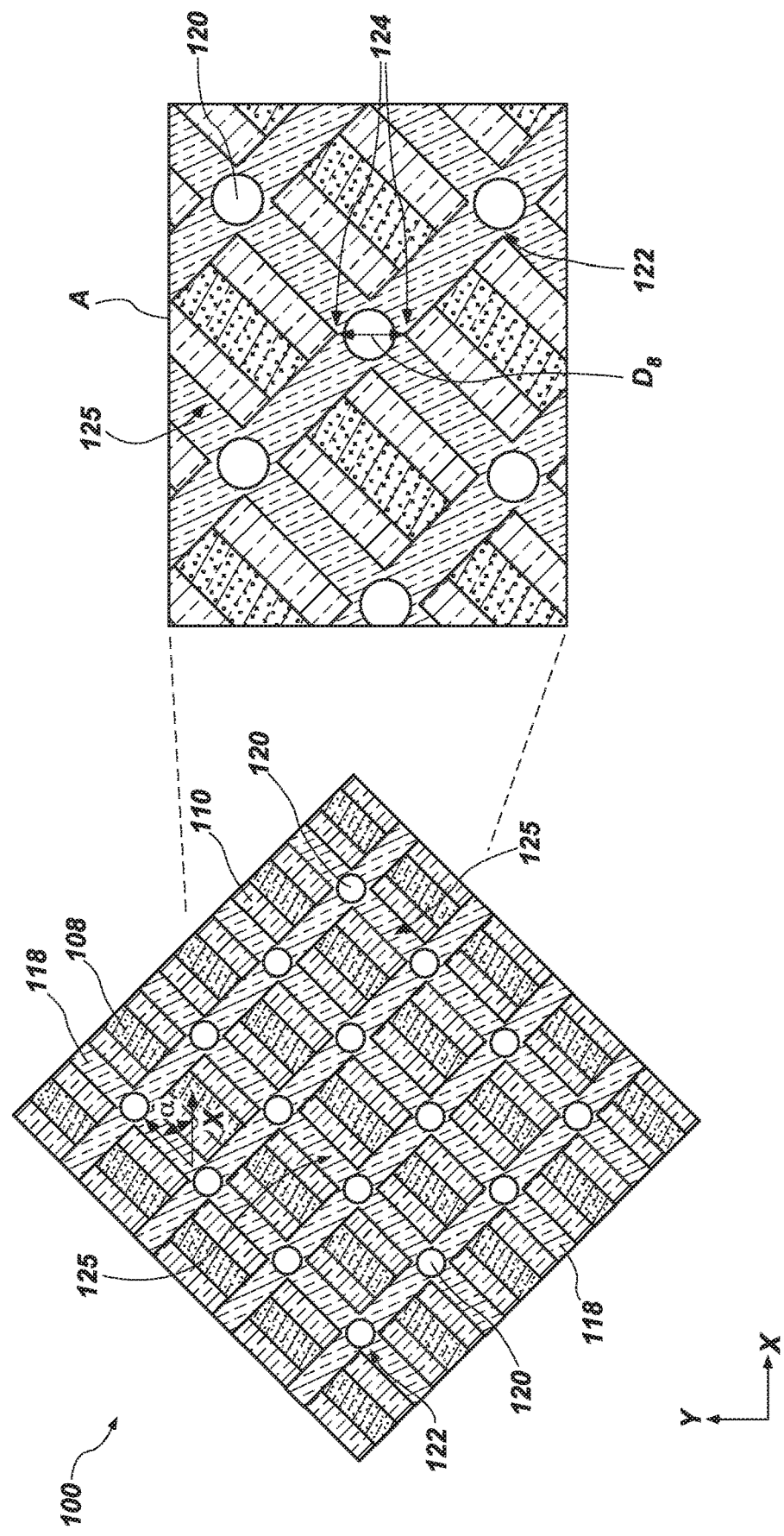

Referring now to FIG. 1G, after forming the second trenches 116 (FIG. 1F), a sacrificial material 118 may be formed within the first trenches 115 (FIG. 1F) and the second trenches 116. The sacrificial material 118 may at least partially intervene between portions of the first spacers 108 and the second spacers 110 of the isolated structures 125. For example, the sacrificial material 118 may intervene between and separate different isolated structures 125 of the isolated structures 125. As will be described herein, one or more features of the microelectronic device structure 100 may be patterned at an angle relative to the longitudinal axis $L_1$ (FIG. 1E) and the longitudinal axis $L_2$ (FIG. 1E). For clarity and ease of understanding of the description, FIG. 1G and the subsequent figures are illustrated as having been rotated relative to the views of the microelectronic device structure 100 of FIG. 1A through FIG. 1F.

In some embodiments, portions of the sacrificial material 118 formed outside of the first trenches 115 (FIG. 1F) and the second trenches 116 (FIG. 1F) and on upper surfaces of the first spacers 108 and the second spacers 110 may be removed. For example, the microelectronic device structure 100 may be exposed to a CMP process to remove portions of the sacrificial material 118 outside of the first trenches 115 and the second trenches 116, such that upper surfaces of the sacrificial material 118 are substantially co-planar with upper surfaces of the first spacers 108 and the second spacers 110.

The sacrificial material 118 may be formed of and include one or more materials exhibiting an etch selectivity with respect to the first spacers 108 and the second spacers 110. In some embodiments, the sacrificial material 118 includes one or more of the materials described above with reference to the third spacers 114 (FIG. 1E). In some embodiments, the sacrificial material 118 comprises the same material composition as the third spacers 114. In some embodiments, the sacrificial material 118 comprises silicon nitride.

The sacrificial material 118 may be formed by one or more of CVD, ALD, PVD, LPCVD, PECVD, spin-on coating, blanket coating, or other methods. In some embodiments, the sacrificial material 118 is formed by ALD or CVD.

After formation of the sacrificial material 118, openings 120 (e.g., gaps, spaces, voids) may remain at intersections 122 of the first trenches 115 (FIG. 1F) and the second trenches 116 (FIG. 1F). The openings 120 may be formed by so-called "pinching" of the sacrificial material 118 at the intersections 122 during formation of the sacrificial material 118 within the first trenches 115 and the second trenches 116. For example, and without being bound by any particular theory, since the width $W_2$ (FIG. 1C, FIG. 1D) of the first trenches 115 and the width $W_3$ (FIG. 1F) of the second trenches 116 are less than a distance between opposite diagonal corners 124 of the intersections 122 (e.g., opposing corners of diagonally adjacent isolation structures 125), the openings 120 may be formed during formation (e.g., deposition) of the sacrificial material 118. In some embodiments, since the openings 120 are located substantially at central portions of the intersections 122, the openings 120 may be referred to as "self-aligned" openings.

The openings 120 may exhibit a cross-sectional shape that is substantially elliptical (e.g., substantially circular, substantially oval), rectangular, square, triangular, cross-shaped, or another shape. In some embodiments, the openings 120 are substantially circular shaped. In other embodiments, the openings 120 are substantially oval shaped. The size and shape of the openings 120 may be at least partially affected by the width $W_2$ (FIG. 1C, FIG. 1D) of the first trenches 115 (FIG. 1F) and the width $W_3$ (FIG. 1F) of the second trenches 116 (FIG. 1F).

Box A of FIG. 1G illustrates an enlarged portion of the microelectronic device structure 100. With reference to box A, the openings 120 may be located substantially at central portions of the intersections 122 of the first trenches 115 (FIG. 1F) and the second trenches 116 (FIG. 1F).

As noted above, in some embodiments, a distance $D_8$ between opposing corners 124 of opposing isolated structures 125 may be greater than the width $W_2$ (FIG. 1C, FIG. 1D) of the first trenches 115 (FIG. 1F) and the width $W_3$ (FIG. 1F) of the second trenches 116 (FIG. 1F). In some embodiments, the distance $D_8$ is within a range from about 30 nm to about 60 nm, such as from about 30 nm to about 40 nm, from about 40 nm to about 50 nm, or from about 50 nm to about 60 nm. However, the disclosure is not so limited and the distance $D_8$ may be different than those described above.

In some embodiments, an oxide material (not shown) may be formed on outer portions of the sacrificial material 118. By way of non-limiting example, in some embodiments, an oxide material may form on exposed portions of the sacrificial material 118 after formation of the sacrificial material 118.

Figure 1I:
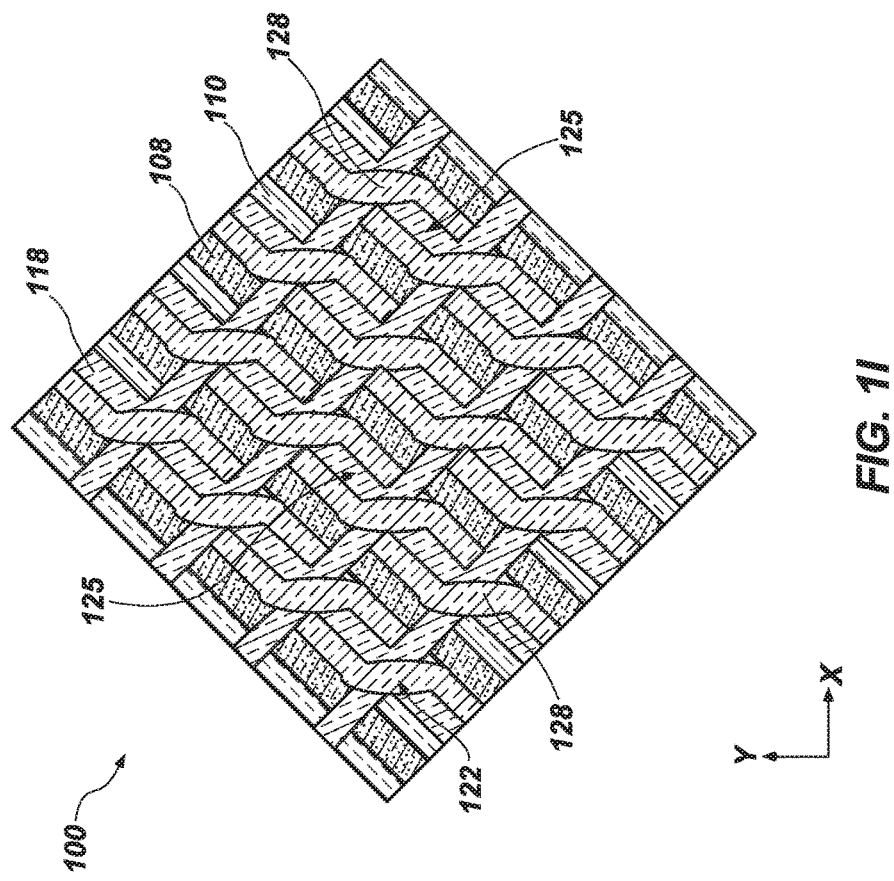
Figure 1H:
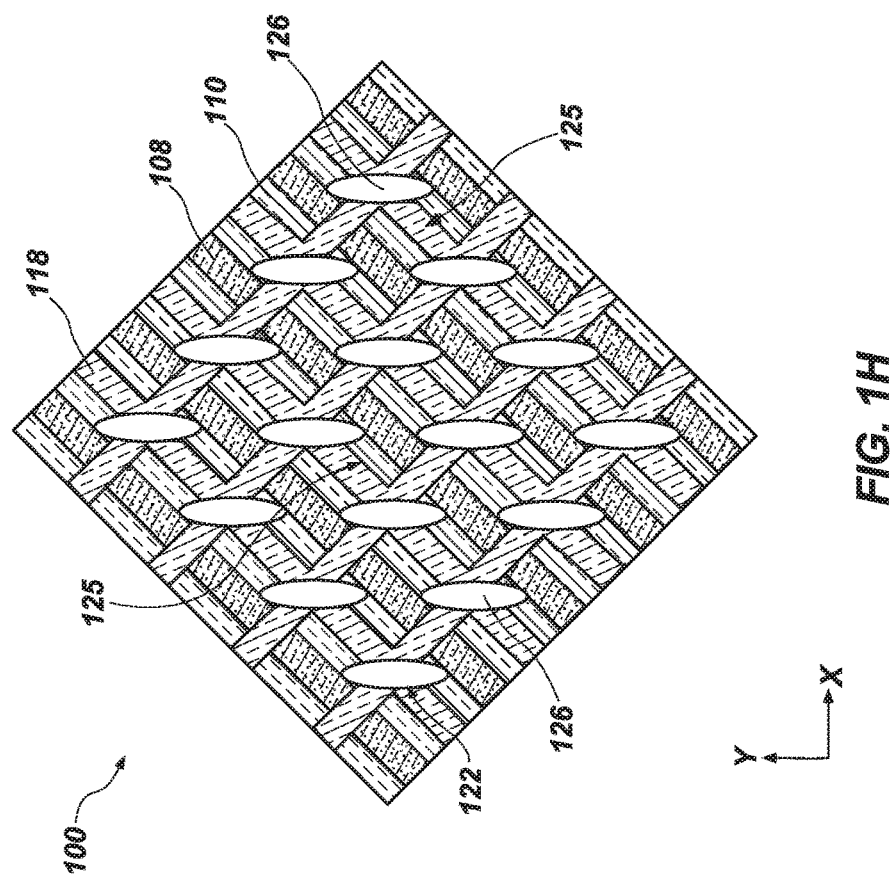

Referring now to FIG. 1H, the microelectronic device structure 100 may be exposed to one or more material removal processes to form elongate openings 126 from the openings 120 (FIG. 1G). In some embodiments, the openings 120 may be elongated in one or more directions (e.g., the Y-direction) selective to other directions (e.g., the X-direction). In some embodiments, the elongate openings 126 may have a dimension in a first direction (e.g., the Y-direction) that is larger than a corresponding dimension of the openings 120 in the same direction. The elongate openings 126 may have a dimension in a second direction (e.g., the X-direction) that is substantially the same as a corresponding dimension of the openings 120 in the same direction.

In some embodiments, each elongate opening 126 extends from one of the isolated structures 125 to an adjacent isolated structure 125. For example, each elongate opening 126 may extend from an upper (in the view of FIG. 1H; e.g., in the Y-direction) one of the second spacers 110 of one isolated structure 125 in the Y-direction to one of the second spacers 110 of an adjacent one of the isolated structures 125. Stated another way, the elongate opening 126 may extend from one second line 112 of an isolated structure 125, across the second trench 116 (FIG. 1F) and to a nearest second line 112 of another of the isolated structures 125.

In some embodiments, the elongate openings 126 are formed by exposing the sacrificial material 118 proximate the openings 120 (FIG. 1G) to one or more etchants at conditions configured to preferentially remove the sacrificial material 118 in one lateral direction (e.g., the Y-direction) relative to another lateral direction (e.g., the X-direction). In some embodiments, elongate openings 126 are formed by exposing the microelectronic device structure 100 to one or more dry etchants (e.g., plasmas) directed at the openings 120 in the Y-direction and not in the X-direction. Stated another way, the dry etchants may be directed in the Y-direction and may not have a velocity in the X-direction or may have a velocity in the X-direction that is substantially less than a velocity of the dry etchants in the Y-direction. In some such embodiments, the openings 120 may be elongated in the direction in which the dry etchants are oriented (e.g., the Y-direction) without substantially increasing a dimension of the openings 120 in another direction (e.g., the X-direction). In other words, the openings 120 may be preferentially etched in the Y-direction relative to the X-direction.

With reference to FIG. 1I, the elongate openings 126 may be filled with an oxide material 128. The oxide material 128 may extend from one of the second spacers 110 of one of the isolated structures 125 to an adjacent (e.g., a nearest) second spacer 110 of an adjacent (e.g., in the Y-direction; a diagonally adjacent) one of the isolated structures 125. For example, the oxide material may extend from an isolated structure at one corner 124 (FIG. 1G) of the intersection 122 to another isolated structure 125 at a diagonally opposite corner 124 of the intersection 122. In some embodiments, the oxide material 128 may be in contact with the second spacers 110 of the isolated structures 125. Stated another way, in some embodiments, the oxide material 128 may bridge across the sacrificial material 118 at locations corresponding to the first trenches 115 (FIG. 1F) and the second trenches (FIG. 1F) (e.g., at intersections of the first trenches 115 and the second trenches 116) and may extend diagonally across the intersections 122.

The oxide material 128 may be formed of and include one or more oxide materials. The oxide material 128 may be formulated to exhibit an etch selectivity with respect to the sacrificial material 118 and the first spacers 108. In some embodiments, the oxide material 128 comprises silicon dioxide. In some embodiments, the oxide material 128 comprises the same material composition as the second spacers 110.

The oxide material 128 and the second spacers 110 connected by one of the oxide materials 128 may form a so-called "S" shaped structure having rounded (e.g., arcuate) edges. As will be described herein, the oxide material 128 and the second spacers 110 may be used to form (e.g., pattern) semiconductive pillar structures on which one or more features will be formed.

Figure 1K:
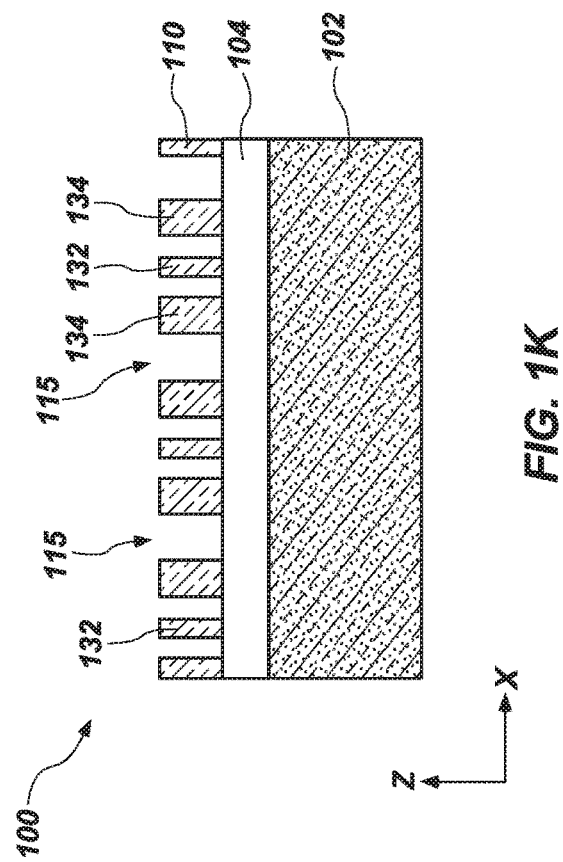
Figure 1J:
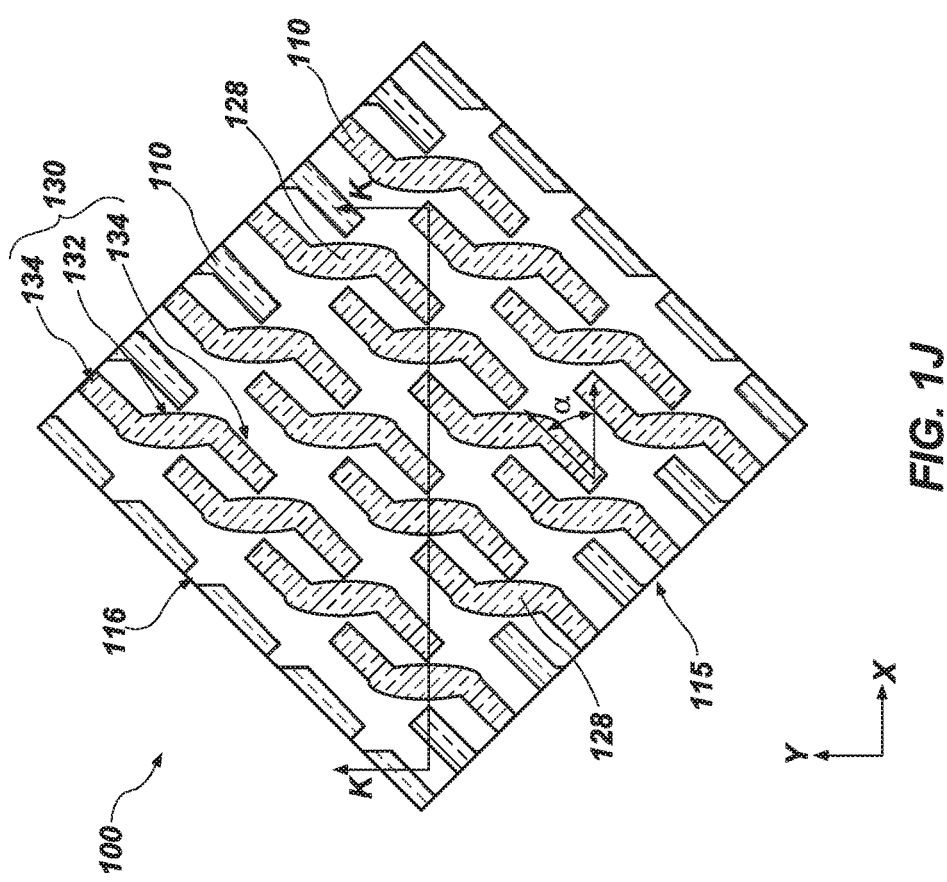

With reference to FIG. 1J and FIG. 1K, the sacrificial material 118 (FIG. 1I) and the first spacers 108 (FIG. 1I) may be removed selective to the second spacers 110 and the oxide material 128, leaving a pattern of pillar structures 130 each individually comprising a central portion 132 located between end portions 134. In other words, each pillar structure 130 may include a first end portion 134, a central portion 132, and a second end portion 134 located on a side of the central portion 132 opposite the first end portion 134. FIG. 1K is a simplified partial cross-sectional view of the microelectronic device structure 100 of FIG. 1J taken through section line K-K of FIG. 1J.

In some embodiments, the pillar structures 130 are formed by exposing the microelectronic device structure 100 to one or more etchants formulated and configured to selectively remove the sacrificial material 118 and the first spacers 108 without substantially removing the second spacers 110 or the oxide material 128. By way of non-limiting example, the microelectronic device structure 100 may be exposed to a plasma including one or more of methane (CH$_4$), trifluoromethane (CHF$_3$) (also referred to as chloroform), difluoromethane (CH$_2$F$_2$), sulfur hexafluoride (SF$_6$), or another material to selectively remove the sacrificial material 118 and the first spacers 108 relative to the second spacers 110 and the oxide material 128. In other embodiments, the microelectronic device structure 100 is exposed to a wet etchant, such as phosphoric acid, to selectively remove the sacrificial material 118 and the first spacers 108 relative to the second spacers 110 and the oxide material 128.

Figure 1L:
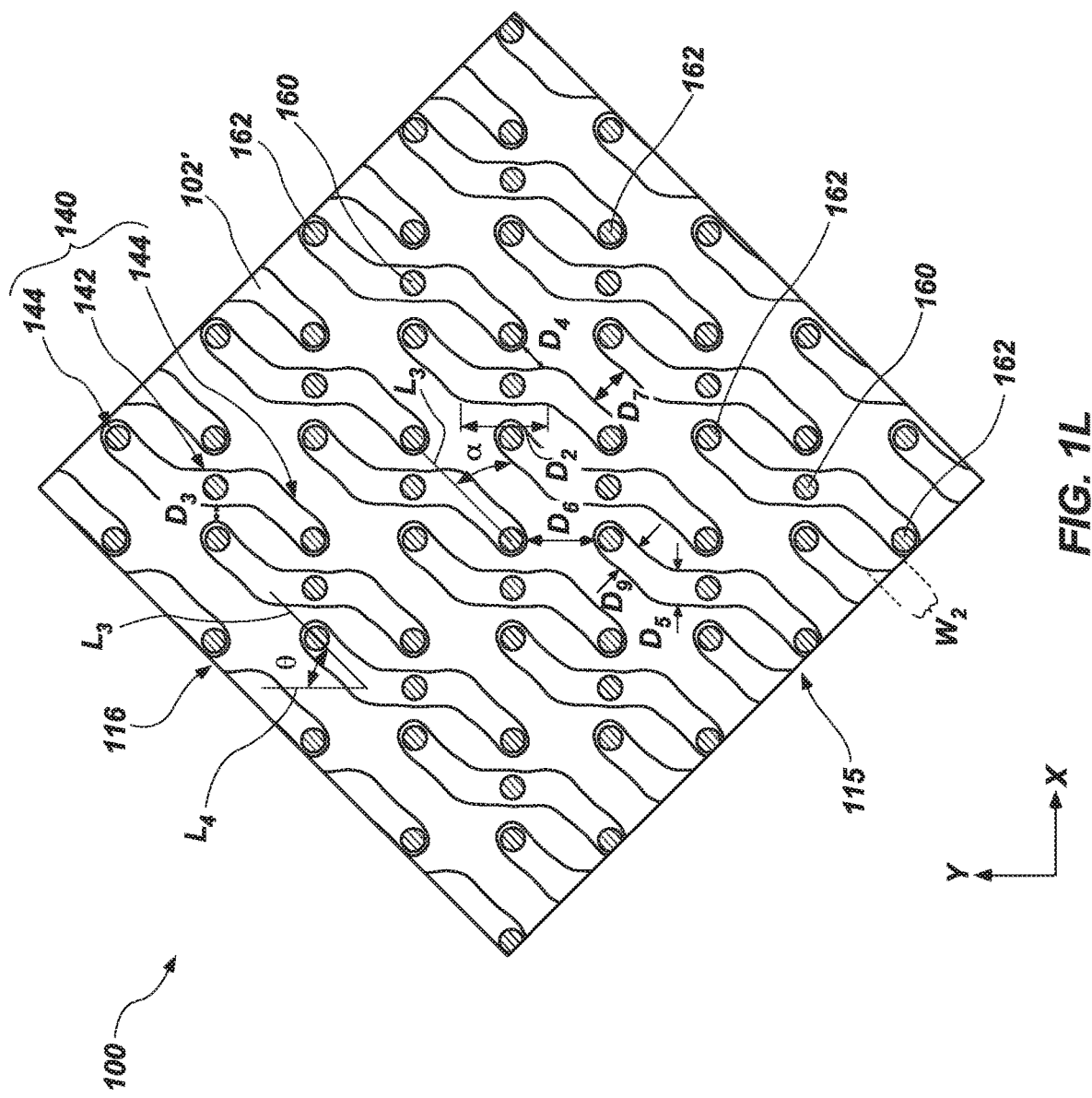

Referring to FIG. 1L, the pillar structures 130 (FIG. 1J) may be used as a mask and the pattern of the pillar structures 130 may be transferred to the etch stop material 104 (FIG. 1K) and the base material 102 to form a patterned etch stop material and a patterned base material 102'. The patterned etch stop material may be used to transfer the pattern of the pillar structures 130 to the base material 102 to form semiconductive pillar structures 140, each individually comprising a central portion 142 and end portions 144, as described above with reference to the central portions 132 and the end portions 144 of the pillar structures 130. For example, the microelectronic device structure 100 may be exposed to one or more etchants formulated and configured to selectively remove the etch stop material 104 without substantially removing second spacers 110 (FIG. 1J) or the oxide material 128 (FIG. 1J). By way of non-limiting example, the etch stop material 104 may be exposed to one or more of a plasma including xenon difluoride (XF$_2$), chlorine (Cl$_2$) (e.g., a mixture of Cl$_2$, nitrogen (N$_2$), and argon (Ar)), fluorine (F$_2$), nitrogen trifluoride (NF$_3$), carbon tetrafluoride (CF$_4$), hydrogen fluoride (HF), or another material. However, the disclosure is not so limited and the etch stop material 104 may be removed by methods other than those described above.

After transferring the pattern of the pillar structures 130 (FIG. 1J) to the etch stop material 104, the patterned etch stop material may be used to transfer the pattern of the patterned etch stop material to the underlying base material 102 to form the semiconductive pillar structures 140 (e.g., elongate semiconductive pillar structures). The semiconductive pillar structures 140 may include rounded edges and correspond to active areas of the microelectronic device structure 100. By way of non-limiting example, portions of the base material 102 exposed through the patterned etch stop material may be removed (e.g., partially removed) to transfer the first trenches 115 and the second trenches 116 into the base material 102 and form the pattern of the semiconductive pillar structures 140.

The semiconductive pillar structures 140 may exhibit an elongate shape having a length (e.g., along the longitudinal axis of the central portion 142 and a longitudinal axis of the end portions 144) that is greater than a width of the semiconductive pillar structures 140 in a direction that is substantially perpendicular to the length. The semiconductive pillar structures 140 may include curved (e.g., arcuate) sides. The orientation of the semiconductive pillar structures 140 may be non-linear since the end portions 144 are angled with respect to the central portion 142.

Adjacent semiconductive pillar structures 140 may be spaced from each other by the first trenches 115 and the second trenches 116. The end portions 144 of the semiconductive pillar structures 140 may be oriented at the first angle α with respect to the first lateral direction (e.g., the X-direction) in which one or more features of the microelectronic device structure 100 will be formed. Stated another way, a longitudinal axis $L_3$ of the end portions 144 may be oriented at the first angle α with respect to the first lateral direction.

A third angle θ between the longitudinal axis $L_3$ of the end portions 144 and a longitudinal axis $L_4$ of the central portions 142 may be greater than about zero (0) degrees and less than about ninety (90) degrees, such as within a range from about twenty (20) degrees to about seventy (70) degrees, from about thirty (30) degrees to about sixty (60)

degrees, or from about forty (40) degrees to about fifty (50) degrees. In some embodiments, the third angle θ is about forty-nine (49) degrees.

In some embodiments, the first trenches 115 may separate the end portions 144 of the semiconductive pillar structures 140 from each other. For example, an upper end portion 144 of a first semiconductive pillar structure 140 may be spaced from a lower end portion 144 of a laterally adjacent second semiconductive pillar structure 140 by the first trench 115. In addition, the upper end portion 144 of the first semiconductive pillar structure 140 may be separated from the lower end portion 144 of a laterally adjacent third semiconductive pillar structure 140 by another of the first trenches 115. Similarly, a lower end portion 144 of the first semiconductive pillar structure 140 may be spaced from an upper end portion 144 of a fourth semiconductive pillar structure 140 laterally adjacent the first semiconductive pillar structure 140 by one of the first trenches 115 and spaced from an upper end portion 144 of a laterally adjacent fifth semiconductive pillar structure 140 by another of the first trenches 115.

The central portions 142 may extend in a first lateral direction (e.g., in the Y-direction) across the second trenches 116. Accordingly, the second trenches 116 may be divided (e.g., interrupted) by the central portions 142 of the semiconductive pillar structures 140. The second trenches 116 may separate the lower end portion 144 of one of the semiconductive pillar structures 140 from the central portion 142 of a semiconductive pillar structures 140. In addition, the second trenches 116 may separate the upper end portion 144 of one of the semiconductive pillar structures 140 from the central portion 142 of an adjacent semiconductive pillar structures 140.

With continued reference to FIG. 1L, each of the semiconductive pillar structures 140 may include a digit line (e.g., bit line) contact region 160 located on the central portion 142 and storage node (e.g., memory cell) contact regions 162 located on the end portions 144. As will be described herein, digit line contacts and storage node contacts may be formed on the respective ones of the digit line contact regions 160 and the storage node contact regions 162. Although the digit line contact regions 160 and the storage node contact regions 162 have been illustrated in FIG. 1L as having the same lateral dimension as the semiconductive pillar structures 140, it will be understood that the lateral dimension of digit line contact regions 160 and the storage node contact regions 162 may be less than the lateral dimension of the semiconductive pillar structures 140.

The storage node contact regions 162 may be located adjacent (e.g., on, over) the end portions 144. The digit line contact regions 160 may be located adjacent (e.g., on, over) the central portions 142 of the semiconductive pillar structures 140. In some embodiments, the digit line contact regions 160 of a first semiconductive pillar structure is laterally aligned with the storage node contact regions 162 of an adjacent second semiconductive pillar structure 140 and a third semiconductive pillar structure 140.

The lateral dimensions and shapes of the storage node contact regions 162 and the digit line contact regions 160 of the semiconductive pillar structures 140 may correspond to the lateral dimensions and shapes of the first trenches 115 and the second trenches 116.

With continued reference to FIG. 1L, a distance $D_2$ (corresponding to the length of the central portion 142 of the semiconductive pillar structures 140) may be within a range from about 20 nm to about 40 nm, such as from about 20 nm to about 25 nm, from about 25 nm to about 30 nm, from about 30 nm to about 35 nm, or from about 35 nm to about 40 nm. However, the disclosure is not so limited and the distance $D_2$ may be different than those described.

A distance $D_3$ between an end portion 144 of a first semiconductive pillar structure 140 and a central portion 142 of an adjacent, second semiconductive pillar structure 140 (e.g., a distance between a storage node contact region 162 of the first semiconductive pillar structure 140 and the digit line contact region 160) may be within a range from about 10 nm to about 20 nm, such as from about 10 nm to about 15 nm, or from about 15 nm to about 20 nm. However, the disclosure is not so limited and the distance $D_3$ may be different than those described.

A distance $D_4$ between an end portion 144 of a semiconductive pillar structure 140 and a central portion 142 of an adjacent semiconductive pillar structure 140 may be within a range from about 5 nm to about 20 nm, such as from about 5 nm to about 10 nm, from about 10 nm to about 15 nm, or from about 15 nm to about 20 nm. However, the disclosure is not so limited and the distance $D_4$ may be different than those described.

A distance $D_5$ between opposing sides of the central portion 142 may be within a range from about 5 nm to about 15 nm, such as from about 5 nm to about 10 nm, or from about 10 nm to about 15 nm. However, the disclosure is not so limited and the distance $D_5$ may be different than those described.

A distance $D_6$ between an upper end portion 144 of a semiconductive pillar structure 140 and a lower end portion 144 of a vertically adjacent semiconductive pillar structure 140 in a direction substantially parallel with the longitudinal axis $L_4$ of the central portions 142 may be within a range from about 10 nm to about 30 nm, such as from about 10 nm to about 15 nm, from about 15 nm to about 20 nm, from about 20 nm to about 25 nm, or from about 25 nm to about 30 nm. In some embodiments, the distance $D_6$ is about 26 nm. However, the disclosure is not so limited and the distance $D_6$ may be different than those described.

A distance $D_7$ between an upper end portion 144 of a semiconductive pillar structure 140 and a lower end portion 144 of an adjacent semiconductive pillar structure 140 in a direction perpendicular to the sides of the upper end portion 144 and the lower end portion 144 may be within a range from about 5 nm and about 20 nm, such as from about 5 nm to about 10 nm, from about 10 nm to about 15 nm, or from about 15 nm to about 20 nm. However, the disclosure is not so limited and the distance $D_7$ may be different than those described.

A distance $D_9$ between opposing sidewalls of the end portions 144 may be within a range from about 5 nm to about 15 nm, such as from about 5 nm to about 10 nm, or from about 10 nm to about 15 nm. In some embodiments, the distance $D_9$ is substantially the same as the distance $D_5$.

Following the formation of the semiconductive pillar structures 140, the microelectronic device structure 100 may be subjected to additional processing. In some embodiments, the microelectronic device structure 100 may be exposed to one or more ion implantation processes to form so-called source regions, drain regions, and channel regions of transistor structures at least partially formed from the semiconductive pillar structures 140. In some embodiments, the semiconductive pillar structures 140 are exposed to an ion implantation to dope at least upper portions of the patterned base material 102'.

Figure 1M:
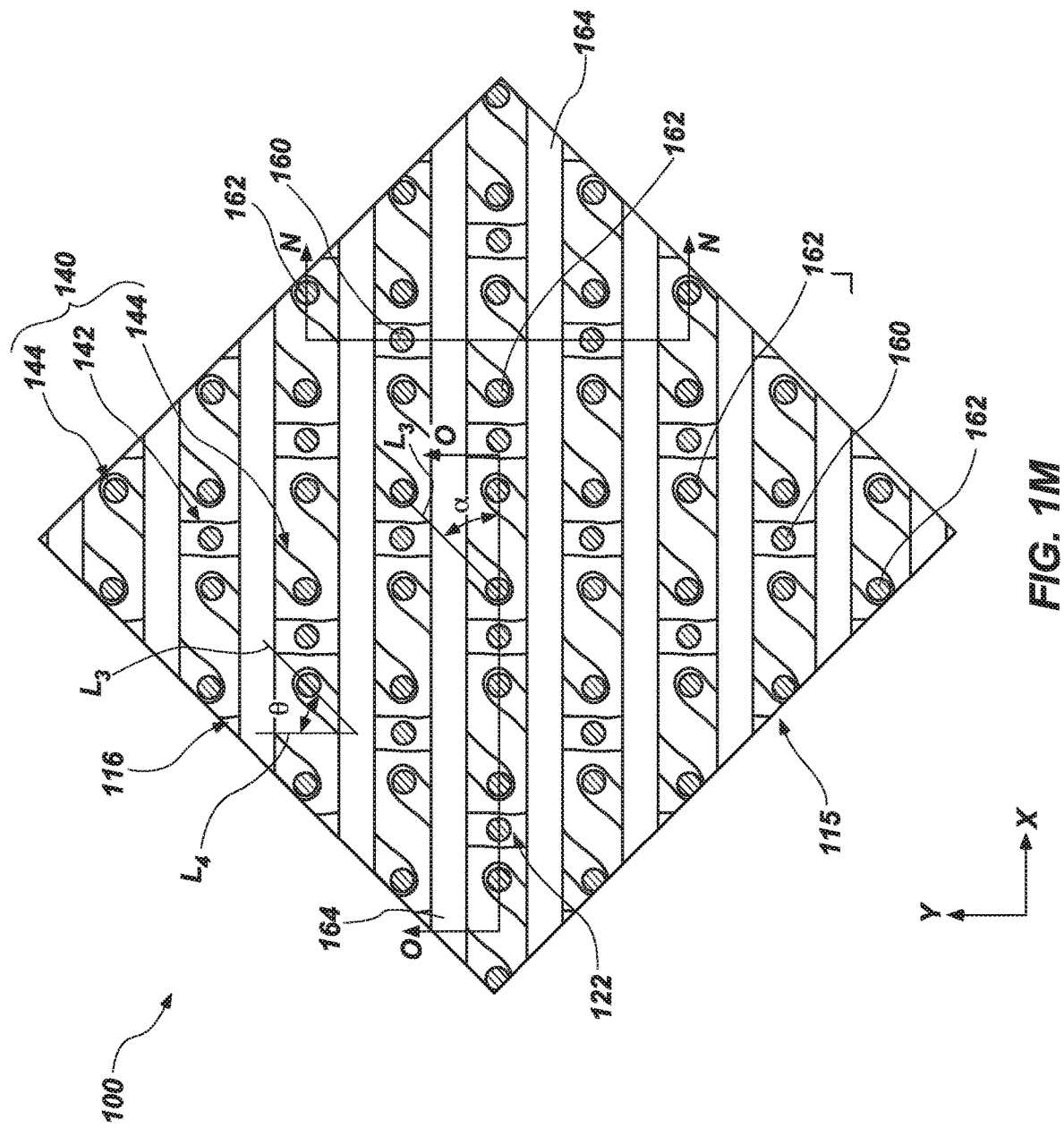
Figure 1N:
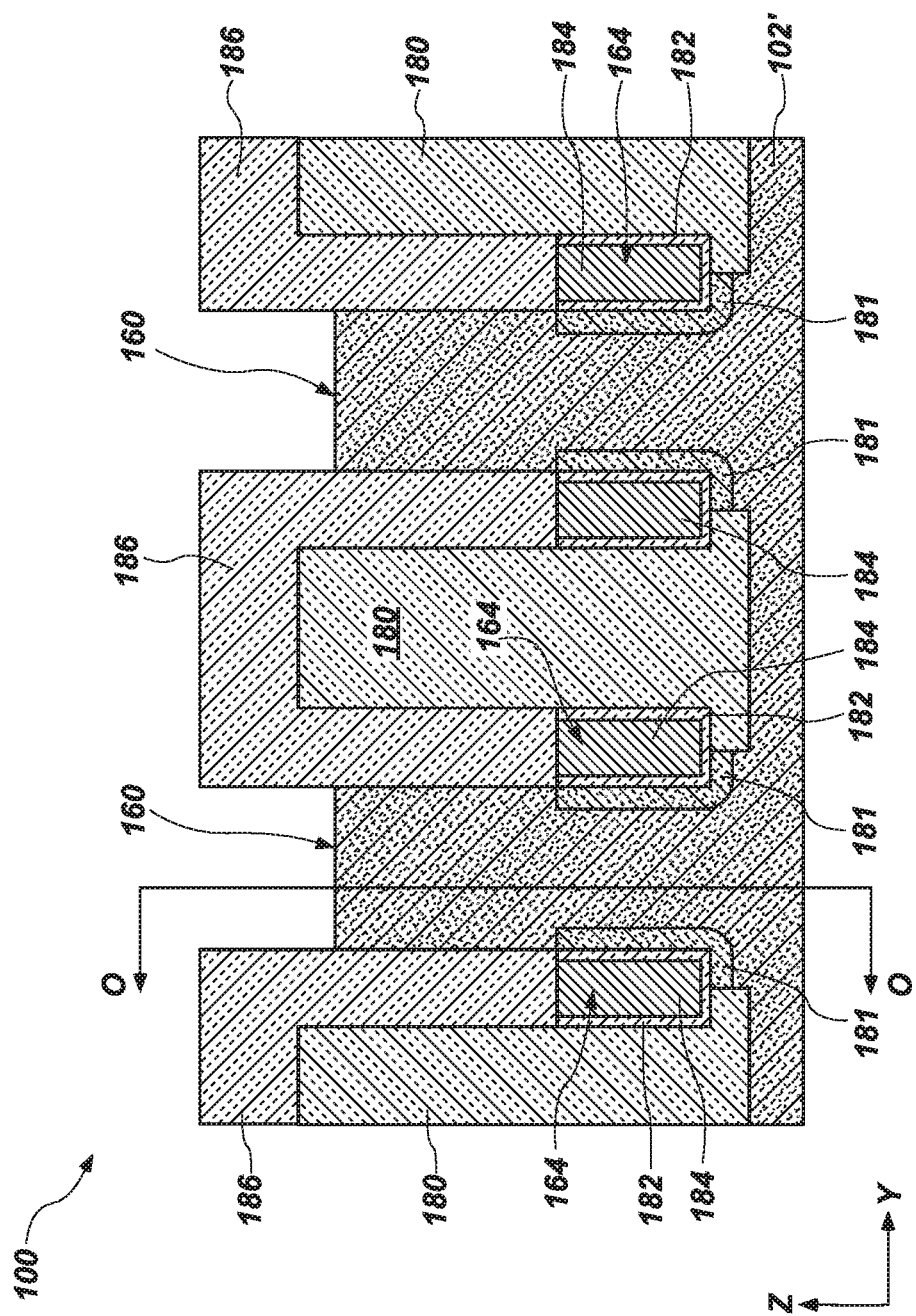
Figure 10:
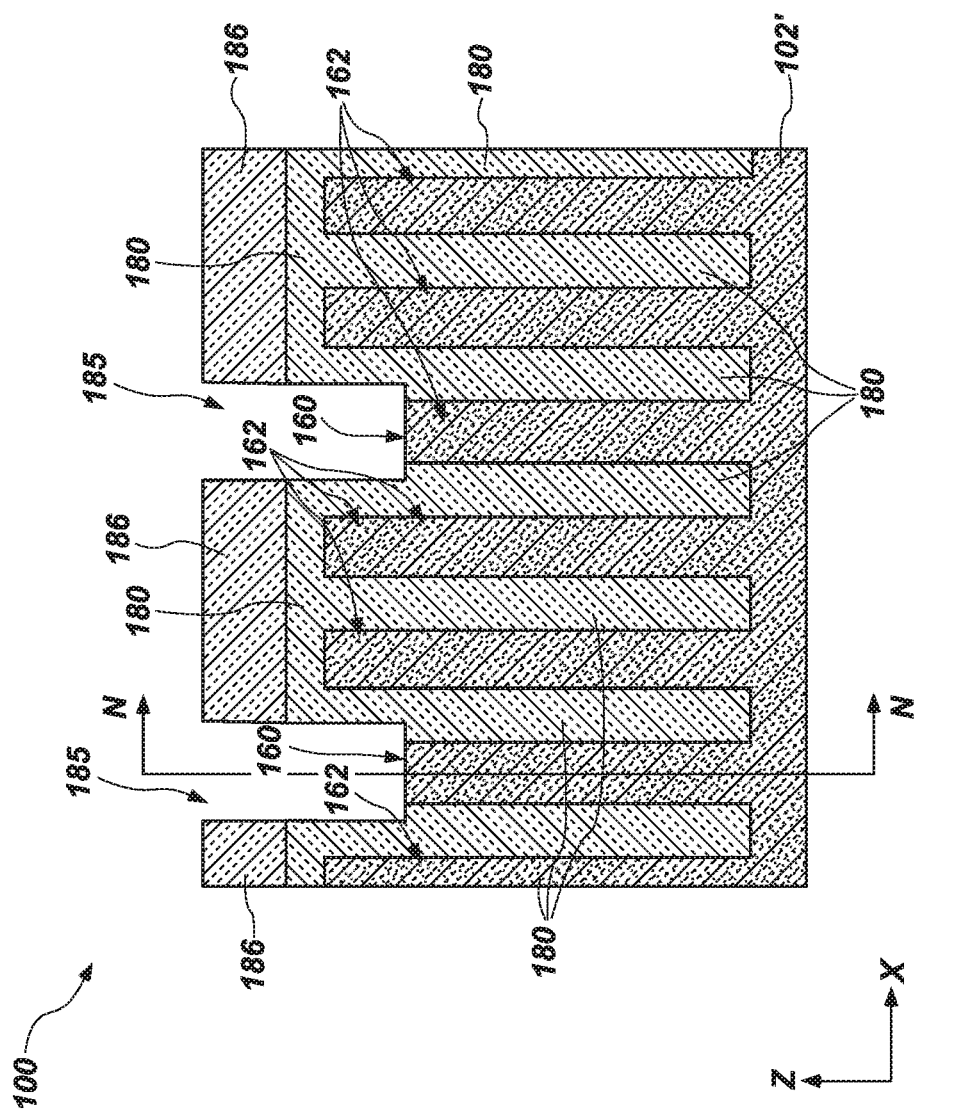

Referring to FIG. 1M, FIG. 1N, and FIG. 1O, word lines 164 may be formed within isolation trenches between the storage node contact regions 162 and the digit line contact regions 160. FIG. 1M is a top view of the microelectronic device structure 100 after subjecting the microelectronic device structure 100 to additional processing. FIG. 1N is a simplified cross-sectional view of the microelectronic device structure 100 of FIG. 1M taken through section line N-N of FIG. 1M, and FIG. 1O is a simplified cross-sectional view of the microelectronic device structure 100 of FIG. 1M taken through section line O-O of FIG. 1M.

With reference to FIG. 1M and FIG. 1N, an insulative material 180 (not illustrated in FIG. 1M for clarity and ease of understanding the description) may be formed over the microelectronic device structure 100 and may fill regions between adjacent semiconductive pillar structure 140 (e.g., the first trenches 115 and the second trenches 116). The insulative material 180 may be formed of and include a dielectric material. In some embodiments, the insulative material 180 comprises silicon dioxide.

After forming the insulative material 180, portions of the insulative material 180 and portions of the semiconductive pillar structures 140 between the central portions 142 and the end portions 144 may be removed. For example, a mask material may be formed over the microelectronic device structure 100 with openings (e.g., trenches) extending in the first lateral direction (e.g., the X-direction) and the portions of the insulative material 180 and portions of the semiconductive pillar structures 140 may be removed through the openings in the mask material.

In some embodiments, after forming the openings, exposed portions of the patterned base material 102' may be exposed to an ion implantation process to form channel regions 181 of transistor structures. A dielectric material 182 (e.g., a gate dielectric material) may be formed within the openings and a conductive material 184 may be formed over the dielectric material 182 to form the word lines 164. The dielectric material 182 may be formed of an include one or more phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), a dielectric carboxynitride material (e.g., silicon carboxynitride (SiOCN)), or combinations thereof.

The conductive material 184 may be formed of and include one or more of titanium nitride, tantalum nitride, titanium aluminum nitride, elemental titanium, elemental platinum, elemental rhodium, elemental iridium, iridium oxide, elemental ruthenium, ruthenium oxide, elemental molybdenum, elemental tungsten, elemental cobalt, polysilicon, germanium, and silicon germanium. In some embodiments, the conductive material 184 comprises one or more of elemental molybdenum, elemental tungsten, and elemental cobalt with one or more of polysilicon, germanium, and silicon germanium.

In some embodiments, and with reference to FIG. 1M, the word lines 164 may separate the central portions 142 from the end portions 144. Stated another way, in some embodiments, the word lines 164 may intervene between the central portions 142 and the end portions 144. Accordingly, the word lines 164 may be located in isolation trenches (e.g., including the insulative material 180) including the word lines 164 therein and separating the digit line contact regions 160 from the storage node contact regions 162 of each of the semiconductive pillar structures 140. Accordingly, the semiconductive pillar structures 140 as described herein may each comprise a central portion 142 spaced from end portions 144 (e.g., a first end portion 144 and a second end portion 144) by word lines 164 (e.g., a first word line 164 and a second word line 164). After forming the word lines 164, remaining portions of the openings may be filled with an insulative material 186, which may include one or more of the materials described above with reference to the insulative material 180. In some embodiments, the insulative material 186 comprises the same material composition as the insulative material 180.

With reference to FIG. 1N and FIG. 1O, after forming the word lines 164, openings 185 may be formed through portions of the insulative material 186 and the insulative material 180 to expose surfaces of the digit line contact regions 160 of the semiconductive pillar structures 140. The openings 185 may be formed by, for example, forming and patterning a mask over the microelectronic device structure 100 and exposing the microelectronic device structure 100 to suitable etchants.

Figure 1P:
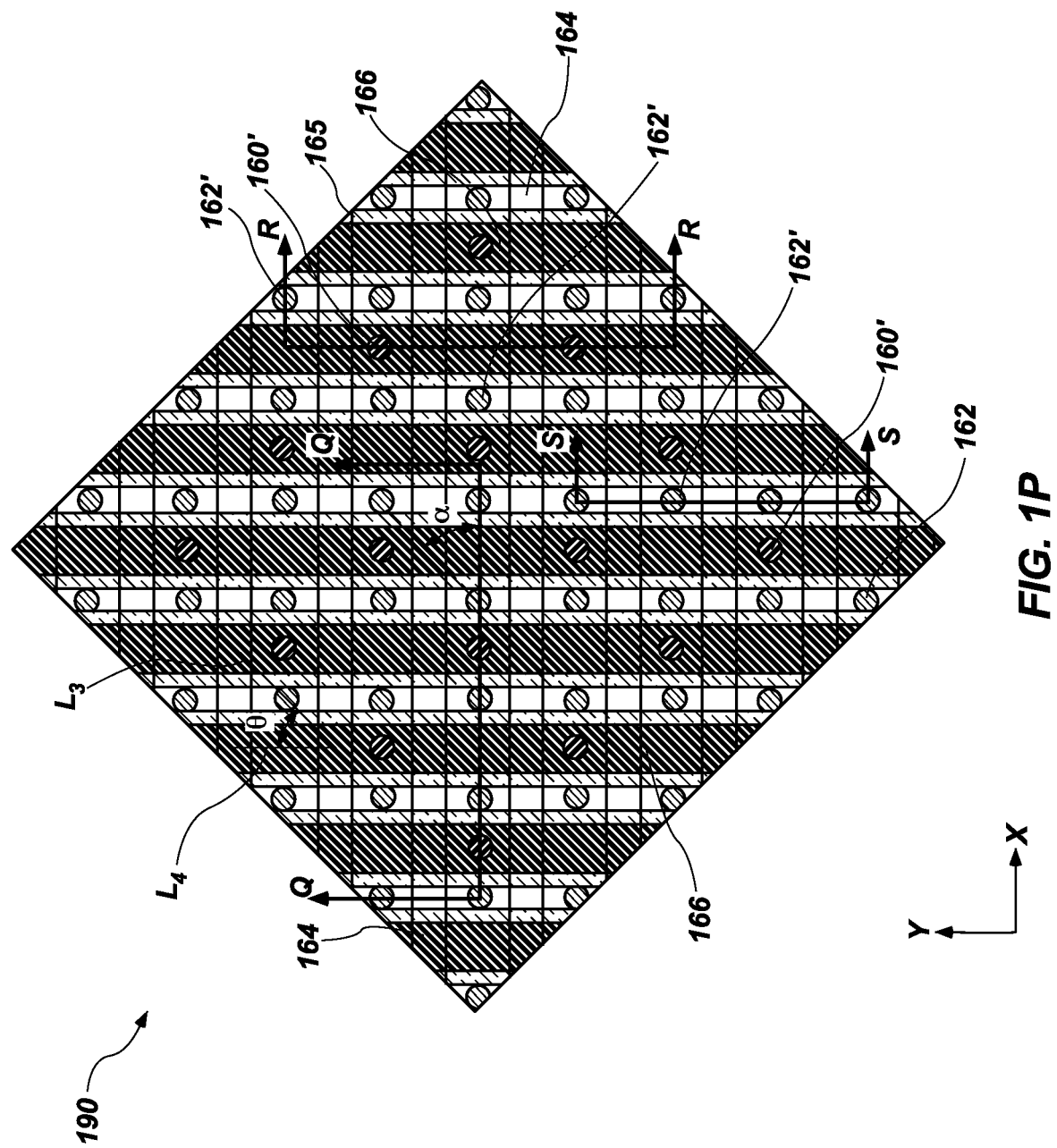
Figure 1Q:
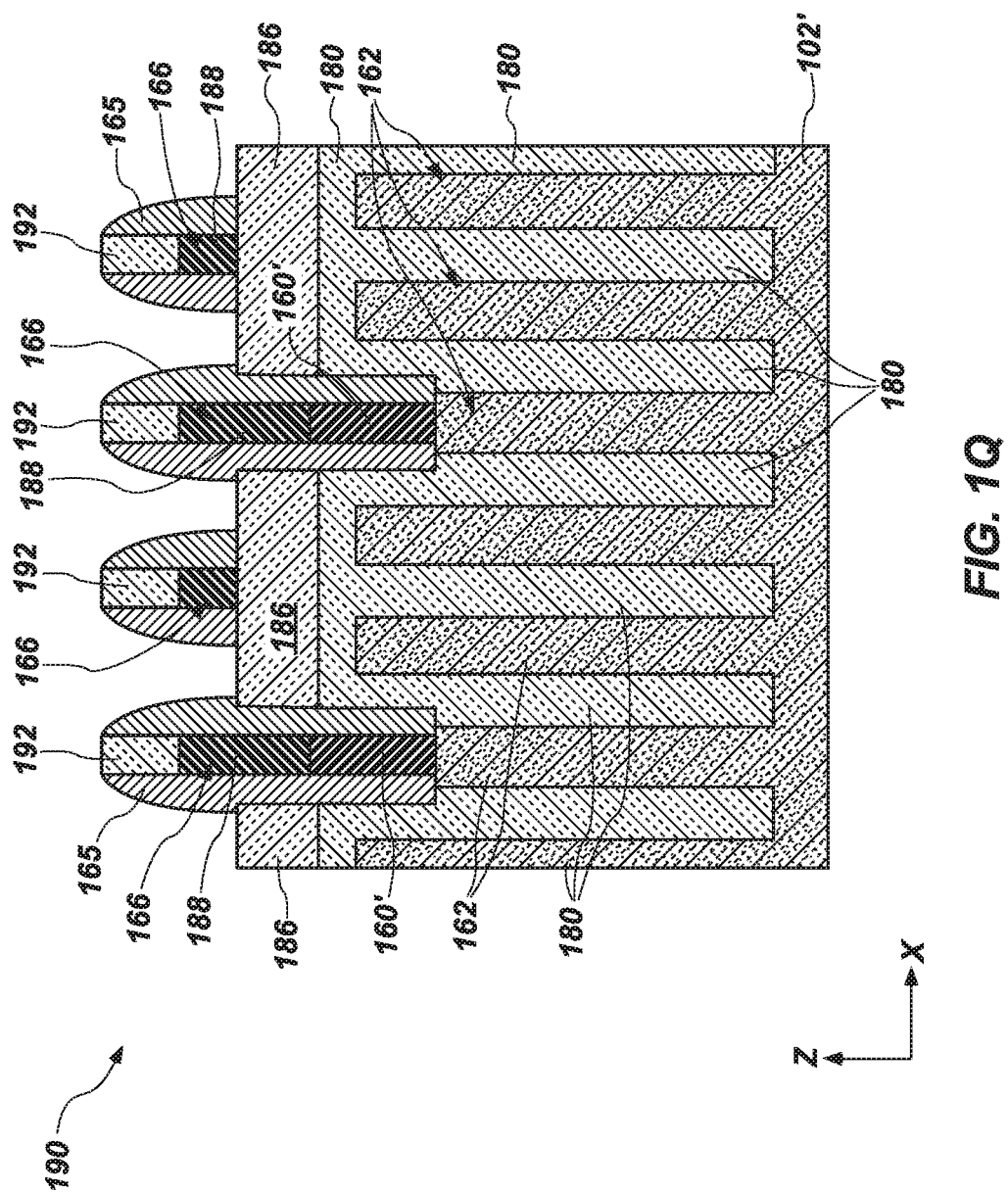
Figure 1R:
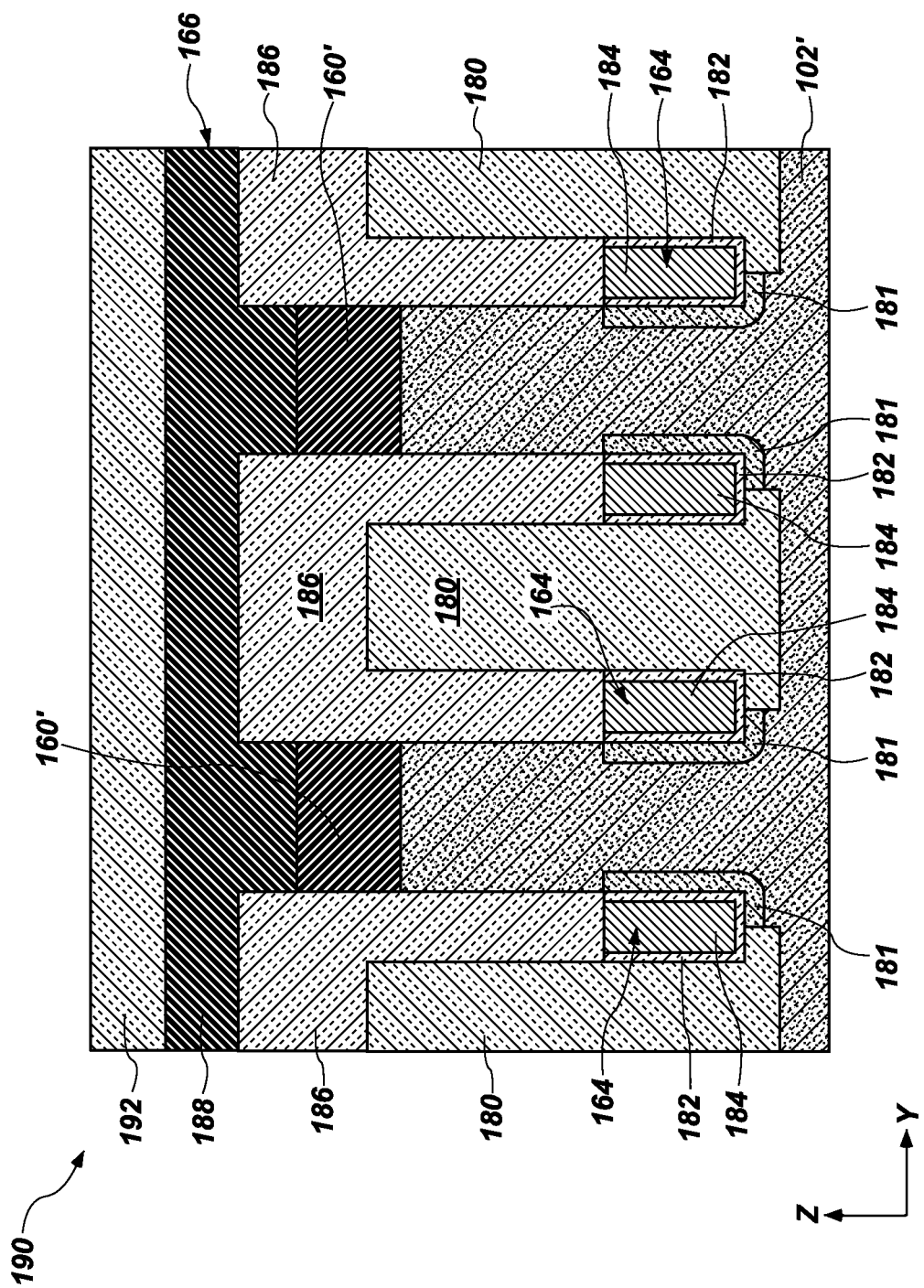

Referring now to FIG. 1P, FIG. 1Q, and FIG. 1R, the microelectronic device structure 100 may be subjected to additional processing to form a microelectronic device 190. FIG. 1P is a top view of the microelectronic device 190; FIG. 1Q is a cross-sectional view taken through section line Q-Q of FIG. 1P; and FIG. 1R is a cross-sectional view taken through section line R-R of FIG. 1P. With reference to FIG. 1P through FIG. 1R, digit line contacts 160' may be formed within the openings 185 and on the digit line contact regions 160. The digit line contacts 160' may be formed of and include at least one electrically conductive material. In some embodiments, the digit line contacts 160' comprise one or more of titanium nitride, tantalum nitride, titanium aluminum nitride, elemental titanium, elemental platinum, elemental rhodium, elemental iridium, iridium oxide, elemental ruthenium, ruthenium oxide, elemental molybdenum, elemental tungsten, elemental cobalt, polysilicon, germanium, and silicon germanium. In some embodiments, the digit line contacts 160' comprise one or more of elemental molybdenum, elemental tungsten, and elemental cobalt with one or more of polysilicon, germanium, and silicon germanium. In some embodiments, the digit line contacts 160' comprise doped polysilicon. By way of non-limiting example, the digit line contacts 160' may include at least about $10^{20}$ atom/cm$^3$, or even at least about $10^{21}$ atom/cm$^3$.

In some embodiments, the digit line contacts 160' are recessed within the openings 185 (FIG. 1O). After forming the digit line contacts 160', a conductive material 188 may be formed over the microelectronic device structure 100 and in contact with the digit line contacts 160' to form the digit lines 166. The conductive material 188 of the digit lines 166 may be formed of and include one or more of the materials described above with reference to the word lines 164.

After forming the digit line contacts 160' and the digit lines 166, an insulative material 192 may be formed over the digit lines 166. In some embodiments, spacers 165 (e.g., "bit line spacers," "digit line spacers") may be formed on sides of the digit lines 166. The insulative material 192 and the spacers 165 may individually be formed of and include one or more of the materials described above with reference to the insulative material 180 and the insulative material 186. In some embodiments, the digit lines 166 do not completely fill the openings 185 (FIG. 1O) and the spacers 165 may be located on sides of the digit lines 166 within the openings 185.

A width of the spacers 165 (e.g., in the direction substantially perpendicular to the longitudinal axis $L_4$ of the digit lines 166 (e.g., the X-direction)) may be within a range from about 5 nm to about 20 nm, such as from about 5 nm to about 10 nm, from about 10 nm to about 15 nm, or from about 15 nm to about 20 nm. However, the disclosure is not so limited and the width may be different than those described.

With reference to FIG. 1S, storage node contacts 162' may be formed over the storage node contact regions 162 of the semiconductive pillar structures 140. The storage node contacts 162' may be formed of and include one or more of the materials described above with reference to the digit line contacts 160'.

The storage node contacts 162' may be in electrical communication with the storage node contact regions 162 of the semiconductive pillar structures 140. The storage node contacts 162' may be located between adjacent portions of the insulative materials 186 and the insulative material 192. The storage node contacts 162' may be formed of and include one or more of the materials described above with reference to the digit line contacts 160'. In some embodiments, the storage node contacts 162' comprise doped polysilicon. By way of non-limiting example, the storage node contacts 162' may include at least about $10^{20}$ atom/cm$^3$, or even at least about $10^{21}$ atom/cm$^3$. In some embodiments, the microelectronic device 190 is exposed to annealing conditions to diffuse dopants from the digit line contacts 160' and the storage node contacts 162' to form, for example, source regions, drain regions, and the channel regions 181 of transistor structures.

With continued reference to FIG. 1P through FIG. 1S, in some embodiments, the digit line contacts 160' may be aligned in the Y-direction and may be offset from the storage node contacts 162' in the X-direction. In some embodiments, the digit line contacts 160' may not be aligned with any of the storage node contacts 162' in a direction in which the digit lines 166 extend. In addition, the storage node contacts 162' may be aligned with each other in the Y-direction. With reference to FIG. 1P, the outline of the semiconductive pillar structures 140 (FIG. 1L, FIG. 1M) are not illustrated for clarity and ease of understanding the description. The digit line contacts 160' and the storage node contacts 162' are illustrated to indicate their relative location with respect to each other. Although the semiconductive pillar structures 140 are not illustrated in FIG. 1P, it will be understood that the semiconductive pillar structures 140 are located in the same location illustrated in FIG. 1M.

The microelectronic device 190 may include memory cells, each including an access transistor (e.g., a transistor comprising a gate along one of the word lines 164) coupled with a storage node structure 194 (e.g., capacitor structure). Only one storage node structure 194 is illustrated in FIG. 1S, but it will be understood that all of the storage node contacts 162' may be coupled to a storage node structure 194.

With continued reference to FIG. 1S, the storage node structures 194 may be formed over and in electrical communication with the storage node contacts 162'. The storage node structures 194 are not illustrated in FIG. 1P for clarity and ease of understanding of the disclosure.

In some embodiments, a redistribution material (RDM) structure 196 (also referred to as "redistribution layer (RDL) structures") may be formed on or over the storage node contacts 162', and the storage node structures 194 may be in electrical communication with the storage node structures 194 and the storage node contacts 162'.

The RDM structures 196 may be configured to effectively shift (e.g., stagger, adjust, modify) lateral positions (e.g., in the X-direction, in the Y-direction) of the storage node contacts 162' to accommodate a desired arrangement (e.g., a hexagonal close packed arrangement) of the storage node structures 194 over and in electrical communication with the storage node contacts 162'. The RDM structures 196 may each individually be formed of and include an electrically conductive material including, but not limited to, one or more of a metal (e.g., tungsten, titanium, nickel, platinum, gold), a metal alloy, a metal-containing material (e.g., metal nitrides, metal silicides, metal carbides, metal oxides), and a conductively-doped semiconductor material (e.g., conductively-doped silicon, conductively-doped germanium, conductively-doped silicon germanium). By way of non-limiting example, the RDM structures 196 may individually comprise one or more of W, TiN, TaN, WN, TiAlN, Ti, Pt, Rh, Ir, IrO$_x$, Ru, RuO$_x$, and alloys thereof.

The storage node structures 194 may be configured to store a charge representative of a programmable logic state. For example, a charged state of the storage node structures 194 may represent a first logic state (e.g., a logic 1), and an uncharged state of the storage node structures 194 may represent a second logic state (e.g., a logic 0). In some embodiments, the storage node structures 194 comprise a dielectric material configured to storage a charge associated with a logic state. The dielectric material may, for example, comprise one or more of include silicon dioxide, silicon nitride, polyimide, titanium dioxide (TiO$_2$), tantalum oxide (Ta$_2$O$_5$), aluminum oxide (Al$_2$O$_3$), an oxide-nitride-oxide material (e.g., silicon dioxide-silicon nitride-silicon dioxide), strontium titanate (SrTiO$_3$) (STO), barium titanate (BaTiO$_3$), hafnium oxide (HfO$_2$), zirconium oxide (ZrO$_2$), a ferroelectric material (e.g., ferroelectric hafnium oxide, ferroelectric zirconium oxide, lead zirconate titanate (PZT), etc.), and a high-k dielectric material. In some embodiments, the storage node structures 194 comprise zirconium oxide.

The RDM structures 196 and the storage node structures 194 may each individually be formed using conventional processes (e.g., conventional deposition processes, such as one or more of in situ growth, spin-on coating, blanket coating, CVD, ALD, and PVD; conventional patterning and material removal processes, such as conventional alignment processes, conventional photolithographic exposure processes, conventional development processes, conventional etching processes) and conventional processing equipment, which are not described in detail herein.

With returned reference to FIG. 1P through FIG. 1S, in additional embodiments, the microelectronic device 190 is formed to exhibit different lateral geometric configurations (e.g., different lateral shapes, different lateral dimensions) of the semiconductive pillar structures 140 by modifying one or more of the first angle a of the first lines 105 (FIG. 1A) (and the corresponding angle of each of the first spacers 108, the second spacers 110, and the first trenches 115), the second angle β of the second lines 112 (FIG. 1E) and the corresponding second trenches 116, and the third angle θ (FIG. 1L) of the end portions 144 with respect to the central portion 142.

Forming the semiconductive pillar structures 140 to include the central portion 142 and the end portions 144 extending at the first angle a with respect to the central portion 142 may facilitate an increased active area for the digit line contacts 160' on the central portion 142 compared to conventional microelectronic devices. In addition, the size and shape of the semiconductive pillar structure 140 may facilitate an increased landing area (e.g., from about 4 nm to about 5 nm more) for the storage node contacts 162' from a lateral edge of the spacers 165 compared to conventional microelectronic device structures. Further, the spacing of the semiconductive pillar structures 140 facilitates an increased width (e.g., in the X-direction) of the spacers 165, which may facilitate a reduction in capacitive coupling of the digit lines 166 compared to conventional microelectronic devices. In addition, the size, shape, and orientation of the semiconductive pillar structures 140 may facilitate an increased distance between word lines 164 and the base material 102 of semiconductive pillar structures 140 to which the word lines 164 are uncoupled (e.g., passing word lines) and such semiconductive pillar structures 140.

Thus, in accordance with embodiments of the disclosure a microelectronic device comprises a semiconductive pillar structure comprising a central portion, a first end portion, and a second end portion on a side of the central portion opposite the first end portion, the first end portion oriented at an angle with respect to the central portion and extending substantially parallel to the second end portion, a digit line contact on the central portion of the semiconductive pillar structure, a first storage node contact on the first end portion, and a second storage node contact on the second end portion.

Thus, in accordance with additional embodiments of the disclosure, a method of forming a microelectronic device comprises forming isolated structures comprising a silicon-containing material and an oxide material on sides of the silicon-containing material, the isolated structures separated by first trenches extending in a first direction and second trenches extending in a second direction; forming a sacrificial material in at least a portion of the first trenches and the second trenches; removing at least some of the sacrificial material at intersections of the first trenches and the second trenches to form elongate openings; filling the elongate openings with an additional oxide material; selectively removing the silicon-containing material and the sacrificial material relative to the oxide material and the additional oxide material; removing portions of a semiconductive material exposed through remaining portions of the oxide material and the additional oxide material to form semiconductive pillar structures; and forming storage node contacts on end portions of at least one of the semiconductive pillar structures and a digit line contact on a central portion of the at least one semiconductive pillar structure.

Thus in accordance with further embodiments of the disclosure, a method of forming a microelectronic device comprises forming first trenches between lines of an oxide material, forming second trenches through portions of the oxide material and a silicon-containing material to form isolated structures comprising the silicon-containing material and the oxide material on sides of the silicon-containing material, forming a sacrificial material in at least a portion of the first trenches and the second trenches, removing at least some of the sacrificial material at intersections of the first trenches and the second trenches to form elongate openings, selectively removing the silicon-containing material and the sacrificial material relative to the oxide material, removing portions of a semiconductive material exposed through remaining portions of the oxide material to form semiconductive pillar structures, and forming storage node contacts on end portions of at least one of the semiconductive pillar structures and a digit line contact on a central portion of the at least one semiconductive pillar structure.

Figure 2:
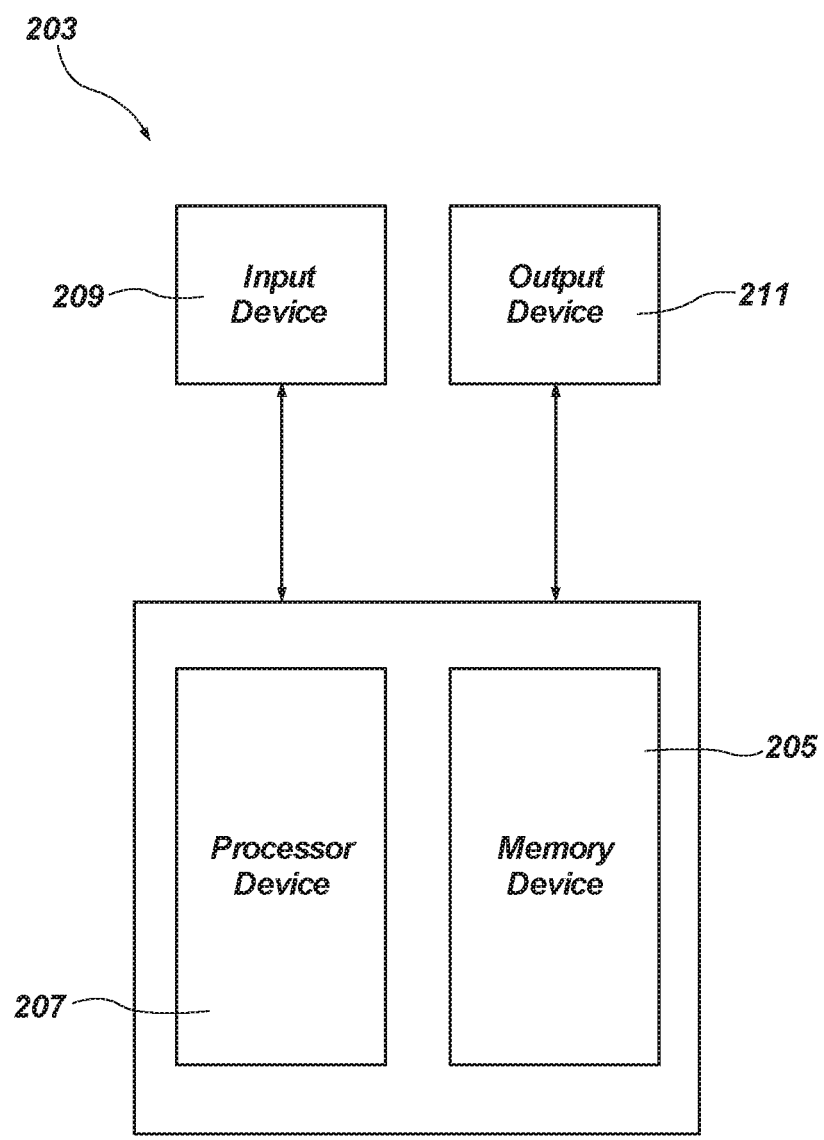
FIG. 2 is a block diagram of an electronic system, in accordance with embodiments of the disclosure.

Microelectronic devices including microelectronic devices (e.g., the microelectronic device 190) and microelectronic device structures (e.g., the microelectronic device structures 100) formed according to embodiments described herein may be used in embodiments of electronic systems of the disclosure. For example, FIG. 2 is a block diagram of an electronic system 203, in accordance with embodiments of the disclosure. The electronic system 203 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 203 includes at least one memory device 205. The memory device 205 may include, for example, an embodiment of a microelectronic device structure previously described herein (e.g., the microelectronic device structure 100) or a microelectronic device (e.g., the microelectronic device 190) previously described with reference to FIG. 1A through FIG. 1T.

The electronic system 203 may further include at least one electronic signal processor device 207 (often referred to as a "microprocessor"). The electronic signal processor device 207 may, optionally, include an embodiment of a microelectronic device or a microelectronic device structure previously described herein (e.g., one or more of the microelectronic device 190 or the microelectronic device structure 100 previously described with reference to FIG. 1A through FIG. 1T). The electronic system 203 may further include one or more input devices 209 for inputting information into the electronic system 203 by a user, such as, for example, a mouse or other pointing device, a keyboard, a touchpad, a button, or a control panel. The electronic system 203 may further include one or more output devices 211 for outputting information (e.g., visual or audio output) to a user such as, for example, a monitor, a display, a printer, an audio output jack, a speaker, etc. In some embodiments, the input device 209 and the output device 211 may comprise a single touchscreen device that can be used both to input information to the electronic system 203 and to output visual information to a user. The input device 209 and the output device 211 may communicate electrically with one or more of the memory device 205 and the electronic signal processor device 207.

Figure 3:
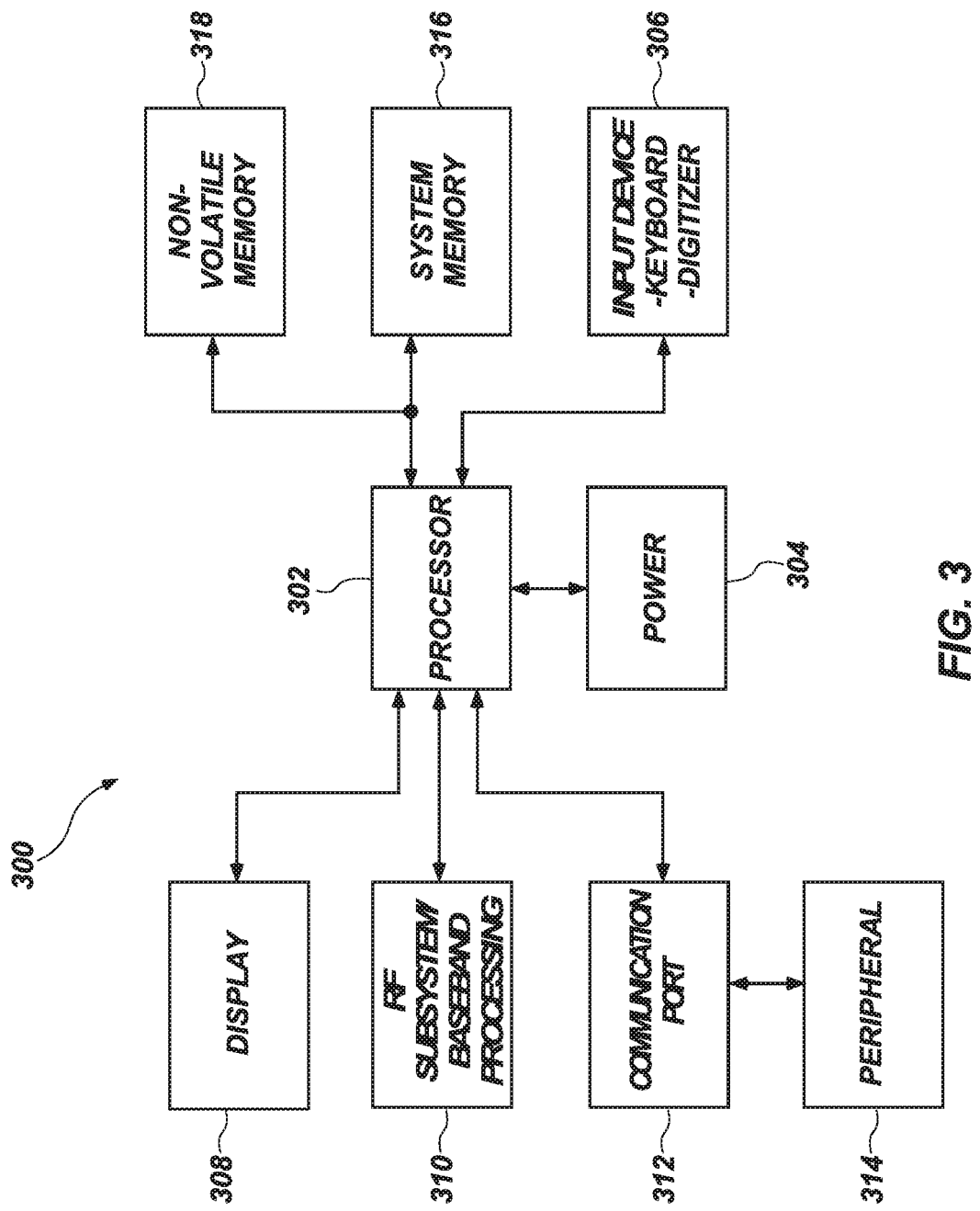
FIG. 3 is a block diagram of a processor-based system, in accordance with embodiments of the disclosure.

With reference to FIG. 3, depicted is a processor-based system 300. The processor-based system 300 may include various microelectronic devices and microelectronic device structures (e.g., microelectronic devices and microelectronic device structures including one or more of the microelectronic device 190 or the microelectronic device structure 100) manufactured in accordance with embodiments of the present disclosure. The processor-based system 300 may be any of a variety of types such as a computer, pager, cellular phone, personal organizer, control circuit, or other electronic device. The processor-based system 300 may include one or more processors 302, such as a microprocessor, to control the processing of system functions and requests in the processor-based system 300. The processor 302 and other subcomponents of the processor-based system 300 may include microelectronic devices and microelectronic device structures (e.g., microelectronic devices and microelectronic device structures including one or more of the microelectronic device 190 or the microelectronic device structure 100) manufactured in accordance with embodiments of the present disclosure.

The processor-based system 300 may include a power supply 304 in operable communication with the processor 302. For example, if the processor-based system 300 is a portable system, the power supply 304 may include one or more of a fuel cell, a power scavenging device, permanent batteries, replaceable batteries, and rechargeable batteries. The power supply 304 may also include an AC adapter;

therefore, the processor-based system 300 may be plugged into a wall outlet, for example. The power supply 304 may also include a DC adapter such that the processor-based system 300 may be plugged into a vehicle cigarette lighter or a vehicle power port, for example.

Various other devices may be coupled to the processor 302 depending on the functions that the processor-based system 300 performs. For example, a user interface 306 may be coupled to the processor 302. The user interface 306 may include input devices such as buttons, switches, a keyboard, a light pen, a mouse, a digitizer and stylus, a touch screen, a voice recognition system, a microphone, or a combination thereof. A display 308 may also be coupled to the processor 302. The display 308 may include an LCD display, an SED display, a CRT display, a DLP display, a plasma display, an OLED display, an LED display, a three-dimensional projection, an audio display, or a combination thereof. Furthermore, an RF sub-system/baseband processor 310 may also be coupled to the processor 302. The RF sub-system/baseband processor 310 may include an antenna that is coupled to an RF receiver and to an RF transmitter (not shown). A communication port 312, or more than one communication port 312, may also be coupled to the processor 302. The communication port 312 may be adapted to be coupled to one or more peripheral devices 314, such as a modem, a printer, a computer, a scanner, or a camera, or to a network, such as a local area network, remote area network, intranet, or the Internet, for example.

The processor 302 may control the processor-based system 300 by implementing software programs stored in the memory. The software programs may include an operating system, database software, drafting software, word processing software, media editing software, or media playing software, for example. The memory is operably coupled to the processor 302 to store and facilitate execution of various programs. For example, the processor 302 may be coupled to system memory 316, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 316 may include volatile memory, non-volatile memory, or a combination thereof. The system memory 316 is typically large so that it can store dynamically loaded applications and data. In some embodiments, the system memory 316 may include semiconductor devices, such as the microelectronic devices and microelectronic device structures (e.g., the microelectronic device 190 and the microelectronic device structure 100) described above, or a combination thereof.

The processor 302 may also be coupled to non-volatile memory 318, which is not to suggest that system memory 316 is necessarily volatile. The non-volatile memory 318 may include one or more of STT-MRAM, MRAM, read-only memory (ROM) such as an EPROM, resistive read-only memory (RROM), and flash memory to be used in conjunction with the system memory 316. The size of the non-volatile memory 318 is typically selected to be just large enough to store any necessary operating system, application programs, and fixed data. Additionally, the non-volatile memory 318 may include a high-capacity memory such as disk drive memory, such as a hybrid-drive including resistive memory or other types of non-volatile solid-state memory, for example. The non-volatile memory 318 may include microelectronic devices, such as the microelectronic devices and microelectronic device structures (e.g., the microelectronic device 190 and the microelectronic device structure 100) described above, or a combination thereof Thus, in accordance with embodiments of the disclosure an electronic system comprises an input device, an output device, a processor device operably coupled to the input device and the output device, and a memory device operably coupled to the processor device and comprising at least one microelectronic device. The at least one microelectronic device comprises semiconductive pillar structures, each comprising a central portion electrically coupled to a bit line contact and located between end portions electrically coupled to storage node contacts, and word lines oriented at an angle with respect to the end portions and located between and separating the bit line contact and the storage node contact.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   a semiconductive pillar structure comprising a central portion, a first end portion, and a second end portion on a side of the central portion opposite the first end portion, the first end portion oriented at an angle with respect to the central portion and extending substantially parallel to the second end portion;
   a digit line contact on the central portion of the semiconductive pillar structure;
   a digit line electrically coupled to the digit line contact, wherein a longest portion of the digit line is parallel to a longest portion of the central portion;
   a first storage node contact on the first end portion; and
   a second storage node contact on the second end portion.

2. The microelectronic device of claim 1, wherein the angle is within a range from about 40° to about 50°.

3. The microelectronic device of claim 1, wherein the digit line contact is laterally aligned with a storage node contact of an adjacent semiconductive pillar structure.

4. The microelectronic device of claim 1, further comprising a word line extending in a lateral direction between the digit line contact and the first storage node contact and spacing the first end portion from the central portion.

5. The microelectronic device of claim 1, further comprising an insulative material adjacent the digit line.

6. The microelectronic device of claim 5, wherein a width of the insulative material is within a range from about 5 nm and about 20 nm.

7. The microelectronic device of claim 1, wherein the first storage node contact is laterally aligned with a second storage node contact of an adjacent semiconductive pillar structure.

8. The microelectronic device of claim 1, wherein the angle is about 41°.

9. The microelectronic device of claim 1, wherein the semiconductive pillar structure exhibits an S shape comprising rounded edges.

10. The microelectronic device of claim 1, further comprising an additional semiconductive pillar structure, a distance between the first storage node contact of the semiconductive pillar structure and a second storage node contact of the additional semiconductive pillar structure within a range from about 10 nm to about 20 nm.

11. The microelectronic device of claim 1, wherein the digit line is in contact with an additional digit line contact of an additional semiconductive pillar structure neighboring the semiconductive pillar structure.

12. The microelectronic device of claim 11, further comprising two word lines laterally between the digit line contact of the semiconductive pillar structure and the additional digit line contact of the additional semiconductive pillar structure.

13. The microelectronic device of claim 1, wherein the semiconductive pillar structure comprises rounded sides at intersections of the central portion with each of the first end portion and the second end portion.

14. The microelectronic device of claim 1, wherein the semiconductive pillar structure is intersected by only two word lines.

15. The microelectronic device of claim 1, wherein the semiconductive pillar structure does not include storage node contacts in addition to the first storage node contact and the second storage node contact.

16. The microelectronic device of claim 1, wherein each storage node contact of the semiconductive pillar structure is offset from the longest portion of the central portion.

17. The microelectronic device of claim 1, further comprising a word line extending in a lateral direction perpendicular to the digit line, the digit line contact laterally aligned with an additional first storage node contact of an additional semiconductive pillar structure neighboring the semiconductive pillar structure in the lateral direction perpendicular to the digit line.

18. The microelectronic device of claim 17, wherein the digit line contact is laterally between the additional first storage node contact of the additional semiconductive pillar structure and an additional second storage node contact of a further additional semiconductive pillar structure.

19. The microelectronic device of claim 1, further comprising a word line oriented at an angle within a range of from about 20 degrees to about 70 degrees with respect to the first end portion and the second end portion.

20. A microelectronic device, comprising:
a semiconductive pillar structure comprising a central portion, a first end portion, and a second end portion on a side of the central portion opposite the first end portion, the first end portion oriented at an angle with respect to the central portion and extending substantially parallel to the second end portion;
a digit line contact on the central portion of the semiconductive pillar structure;
a digit line electrically coupled to the digit line contact and extending parallel to a longitudinal axis of the central portion;
a first storage node contact on the first end portion;
a second storage node contact on the second end portion; and
two word lines intersecting the semiconductive pillar structure, the semiconductive pillar structure intersected by only the two word lines.

21. An electronic system, comprising: an input device; an output device; a processor device operably coupled to the input device and the output device; and a memory device operably coupled to the processor device and comprising at least one microelectronic device, the at least one microelectronic device comprising: semiconductive pillar structures, each comprising: a central portion electrically coupled to a digit line contact; a first end portion on a side of the central portion; a second end portion on a side of the central portion opposite the first end portion; a first storage node contact on the first end portion; and a second storage node contact on the second end portion, the first end portion oriented at an angle with respect to the central portion and extending substantially parallel to the second end portion; word lines oriented at an angle with respect to the first end portion and the second end portion and located between and separating the digit line contact and each of the first storage node contact and the second storage node contact; and a digit line electrically coupled to the digit line contact, wherein a longest portion of the digit line is parallel to a longest portion of the central portion of the semiconductive pillar structures to which the digit line is electrically coupled.

22. The electronic system of claim 21, wherein the angle is within a range from about 400 to about 500.

23. The electronic system of claim 21, wherein the angle is about 410.

24. The electronic system of claim 21, wherein a distance between the storage node contact of a first semiconductive pillar structure and a digit line contact of an adjacent, second semiconductive pillar structure in a direction parallel with the word lines is within a range from about 10 nm to about 20 nm.

25. The electronic system of claim 21, wherein the semiconductive pillar structures exhibit an S shape.

* * * * *

UNITED STATES PATENT AND TRADEMARK OFFICE
CERTIFICATE OF CORRECTION

PATENT NO. : 11,501,804 B2
APPLICATION NO. : 16/992589
DATED : November 15, 2022
INVENTOR(S) : Fredrick D. Fishburn et al.

It is certified that error appears in the above-identified patent and that said Letters Patent is hereby corrected as shown below:

In the Specification

| | | |
|---|---|---|
| Column 1, | Line 9, | change ", filed on even date herewith, Aug." to --, filed Aug.-- |
| Column 7, | Line 35, | change "angle a may" to --angle α may-- |
| Column 7, | Line 39, | change "angle a is" to --angle α is-- |
| Column 9, | Line 63, | change "angle a may" to --angle α may-- |
| Column 13, | Line 8, | change "FIG. 11, the" to --FIG. 1I, the-- |
| Column 18, | Line 13, | change "FIG. IN and" to --FIG. 1N and-- |
| Column 20, | Line 51, | change "angle a of" to --angle α of-- |
| Column 20, | Line 60, | change "angle a with" to --angle α with-- |

In the Claims

| | | | |
|---|---|---|---|
| Claim 22, | Column 26, | Line 38, | change "400 to about 500." to --40° to about 50°.-- |
| Claim 23, | Column 26, | Line 40, | change "is about 410." to --is about 41°.-- |

Signed and Sealed this
Eleventh Day of June, 2024

Katherine Kelly Vidal
*Director of the United States Patent and Trademark Office*